(12) United States Patent
Yamaya et al.

(10) Patent No.: US 10,627,466 B2
(45) Date of Patent: Apr. 21, 2020

(54) PET/MRI DEVICE, PET DEVICE, AND IMAGE RECONSTRUCTION SYSTEM

(71) Applicant: c/o National Institutes For Quantum And Radiological Science And Technology, Chiba-shi, Chiba (JP)

(72) Inventors: Taiga Yamaya, Chiba (JP); Takayuki Obata, Chiba (JP)

(73) Assignee: NATIONAL INSTITUTES FOR QUANTUM AND RADIOLOGICAL SCIENCE AND TECHNOLOGY, Chiba (JP)

( * ) Notice: Subject to any disclaimer, the term of this patent is extended or adjusted under 35 U.S.C. 154(b) by 641 days.

(21) Appl. No.: 15/403,657

(22) Filed: Jan. 11, 2017

(65) Prior Publication Data

US 2017/0168127 A1 Jun. 15, 2017

Related U.S. Application Data

(60) Continuation of application No. 14/061,143, filed on Oct. 23, 2013, now abandoned, which is a division of
(Continued)

(30) Foreign Application Priority Data

Mar. 9, 2010 (JP) .................................. 2010-52389

(51) Int. Cl.
*G01R 33/48* (2006.01)
*G01R 33/563* (2006.01)
(Continued)

(52) U.S. Cl.
CPC ......... *G01R 33/481* (2013.01); *G01R 33/307* (2013.01); *G01R 33/56375* (2013.01); *G01T 1/1603* (2013.01)

(58) Field of Classification Search
CPC ............................ G01R 33/48; G01R 33/481; G01R 33/56375; G01R 33/307; G01T 1/1603
(Continued)

(56) References Cited

U.S. PATENT DOCUMENTS 7,626,392 B2 12/2009 Nistler et al.
7,750,311 B2 7/2010 Daghighian
(Continued)

FOREIGN PATENT DOCUMENTS

EP 2 138 866 A1 12/2009
JP 2000214263 A 8/2000
(Continued)

OTHER PUBLICATIONS

Schlyer et al., "A Simultaneous PET/MRI Scanner Based on RatCAP in Small Animals," 2007 IEEE Nuclear Science Symposium Conference Record, vol. 5, 2007, pp. 3256-3259.
(Continued)

*Primary Examiner* — Oommen Jacob
(74) *Attorney, Agent, or Firm* — Oliff PLC

(57) ABSTRACT

A PET/MRI device includes an MRI device that has a measurement port, a PET detector that can be inserted into the measurement port, and a mechanism that can slide the PET detector into and out of the MRI measurement port. Thereby, the PET/MRI device allows MRI measurement during PET measurement.

5 Claims, 46 Drawing Sheets

Related U.S. Application Data application No. 12/959,893, filed on Dec. 3, 2010, now abandoned.

(51) Int. Cl.
*G01R 33/30* (2006.01)
*G01T 1/16* (2006.01)

(58) Field of Classification Search
USPC .................................. 600/411, 407
See application file for complete search history.

(56) References Cited

U.S. PATENT DOCUMENTS

| | | | | |
|---|---|---|---|---|
| 7,759,647 B2* | 7/2010 | Grazioso | ............... | G01T 1/1603 250/363.05 |
| 7,847,552 B2* | 12/2010 | Haworth | ............... | G01R 33/28 324/318 |
| 8,073,527 B2* | 12/2011 | Eberler | ............... | G01R 33/481 250/363.03 |
| 8,467,845 B2* | 6/2013 | Martin | ............... | A61B 6/501 600/407 |
| 8,525,116 B2* | 9/2013 | Schulz | ............... | G01T 1/1603 250/363.02 |
| 8,816,686 B2* | 8/2014 | Park | ............... | A61B 5/0035 324/318 |
| 2003/0078489 A1* | 4/2003 | DeSilets | ............... | A61B 6/032 600/407 |
| 2004/0097800 A1* | 5/2004 | Crosetto | ............... | G01T 1/2985 600/407 |
| 2005/0020898 A1* | 1/2005 | Vosniak | ............... | A61B 5/411 600/407 |
| 2006/0052685 A1* | 3/2006 | Cho | ............... | G01T 1/1603 600/407 |
| 2006/0293584 A1* | 12/2006 | Kojima | ............... | A61B 6/032 600/407 |
| 2007/0014391 A1* | 1/2007 | Mostafavi | ............... | A61N 5/1049 378/63 |
| 2007/0055127 A1* | 3/2007 | Ladebeck | ............... | G01R 33/481 600/407 |
| 2007/0078329 A1* | 4/2007 | Vija | ............... | G01T 1/1603 600/407 |
| 2007/0100225 A1* | 5/2007 | Maschke | ............... | A61B 6/032 600/407 |
| 2007/0102641 A1* | 5/2007 | Schmand | ............... | G01R 33/26 250/363.03 |
| 2007/0238950 A1* | 10/2007 | Vija | ............... | A61B 6/032 600/407 |
| 2008/0024127 A1* | 1/2008 | Nagao | ............... | A61B 5/055 324/301 |
| 2008/0033279 A1 | 2/2008 | Ladebeck et al. | | |
| 2008/0088309 A1* | 4/2008 | Eberler | ............... | G01R 33/3415 324/318 |
| 2008/0146914 A1* | 6/2008 | Polzin | ............... | A61B 5/055 600/420 |
| 2008/0214927 A1 | 9/2008 | Cherry et al. | | |
| 2008/0230705 A1 | 9/2008 | Rousso et al. | | |
| 2008/0269594 A1* | 10/2008 | Paul | ............... | G01R 33/481 600/411 |
| 2008/0287772 A1 | 11/2008 | Declerck et al. | | |
| 2009/0005671 A1* | 1/2009 | Kreischer | ............... | A61B 6/037 600/411 |
| 2009/0018431 A1* | 1/2009 | Feiweier | ............... | A61B 5/04008 600/407 |
| 2009/0108206 A1* | 4/2009 | Breuer | ............... | G01R 33/28 250/363.03 |
| 2009/0278535 A1* | 11/2009 | Takizawa | ............... | A61B 5/055 324/309 |
| 2010/0010337 A1* | 1/2010 | Hagen | ............... | A61B 5/0555 600/411 |
| 2010/0102813 A1* | 4/2010 | Schulz | ............... | A61B 6/037 324/309 |
| 2010/0217112 A1* | 8/2010 | Choi | ............... | G01R 33/481 600/411 |
| 2011/0043206 A1* | 2/2011 | Kimura | ............ | G01R 33/56341 324/309 |
| 2011/0092792 A1* | 4/2011 | Birman | ............... | A61B 6/0471 600/407 |
| 2011/0224534 A1* | 9/2011 | Yamaya | ............... | G01R 33/481 600/411 |
| 2012/0223715 A1* | 9/2012 | Park | ............... | A61B 5/0035 324/318 |
| 2013/0307535 A1* | 11/2013 | Taracila | ............. | G01R 33/3415 324/307 |
| 2013/0324836 A1* | 12/2013 | Yamaya | ............... | G01T 1/2985 600/411 |
| 2017/0168127 A1* | 6/2017 | Yamaya | ............... | G01R 33/481 |

FOREIGN PATENT DOCUMENTS

| | | | |
|---|---|---|---|
| JP | 2007163373 | A | 6/2007 |
| JP | 2008089396 | A | 4/2008 |
| JP | 2008525161 | A | 7/2008 |
| JP | 2008232913 | A | 10/2008 |
| JP | 2009121929 | A | 6/2009 |
| JP | 2009186315 | A | 8/2009 |
| JP | 2009236726 | A | 10/2009 |
| WO | 01/87140 | A2 | 11/2001 |
| WO | 2006/071922 | A2 | 7/2006 |
| WO | 2007/147233 | A1 | 12/2007 |
| WO | 2008/129666 | A1 | 10/2008 |
| WO | 2009/125309 | A2 | 10/2009 |
| WO | 2009/128131 | A1 | 10/2009 |

OTHER PUBLICATIONS

Schlemmer et al., "Simultaneous MR/PET Imaging of the Human Brain: Feasibility Study," Radiology, vol. 248, No. 3, Sep. 2008, pp. 1028-1035.

Judenhofer et al., "Simultaneous PET-MRI: a new approach for functional and morphological imaging," Nature Medicine, vol. 14, No. 4, Apr. 2008, pp. 459-465.

Yazaki et al., "Preliminary Study on a New DOI PET Detector with Limited Number of Photo-Detectors," The 5th Korea-Japan Joint Meeting on Medical Physics, Sep. 10-12, 2008.

Yamamoto et al., "Design and performance from an integrated PET/MRI system for small animals," Annals of Nuclear Medicine, vol. 24, No. 2, pp. 89-98, 2010.

Cherry, "The 2006 Henry N. Wagner Lecture: Of Mice and Men (and Positrons)—Advances in PET Imaging Technology," The Journal of Nuclear Medicine, vol. 47, No. 11, pp. 1735-1745, 2006.

Dec. 2, 2011 European Search Report issued in European Patent Application No. 10194990.7.

Hammer et al., "MR-PET: Sub-millimeter MR and PET images in the Same Scanner," Proceedings of the International Society for Magnetic Resonance in Medicine, 6th Scientific Meeting and Exhibition, Apr. 1998, p. 256.

Maramraju et al. "Simultaneous MRI/PET image acquisition from an MRI compatible Positron Emission Tomography system," Proceedings of the International Society for Magnetic Resonance in Medicine, 17th Scientific Meeting and Exhibition, Apr. 2009, p. 592.

Catana et al. "Simultaneous MR and PET Imaging of Human Brain Tumors Using an Integrated MR-PET Scanner," Proceedings of the International Society for Magnetic Resonance in Medicine, 17th Scientific Meeting and Exhibition, Apr. 2009, p. 140.

Jun. 6, 2011 Partial European Search Report issued in European Patent Application No. 10194990.7.

\* cited by examiner

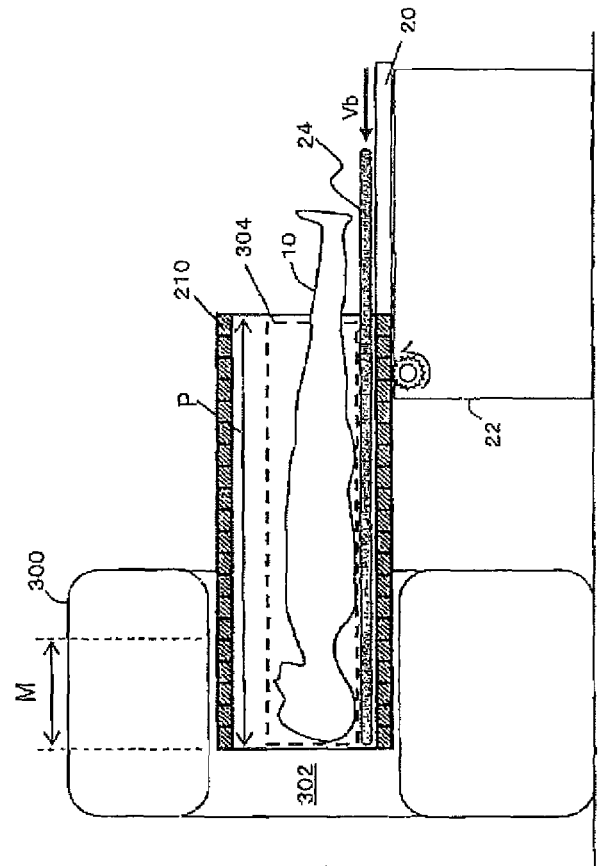
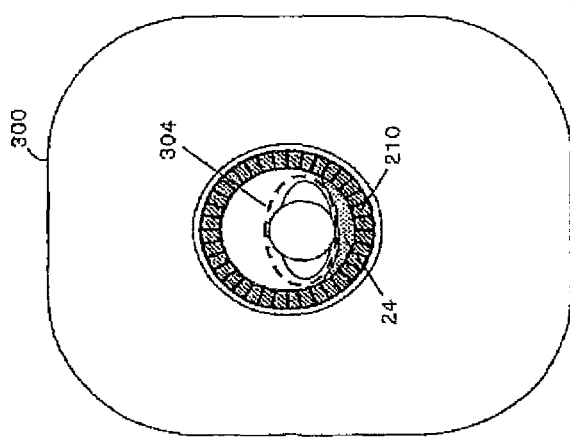

At the start of MRI measurement

At the end of MRI measurement

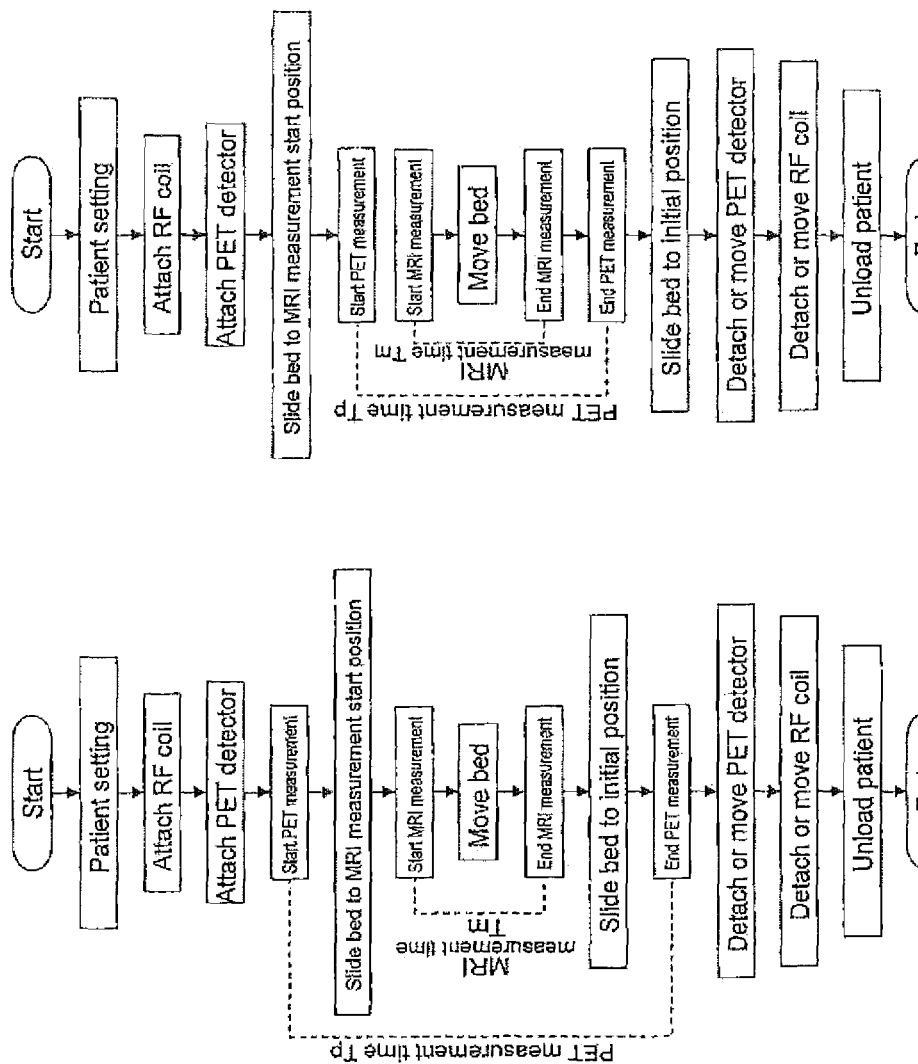

Body        Head

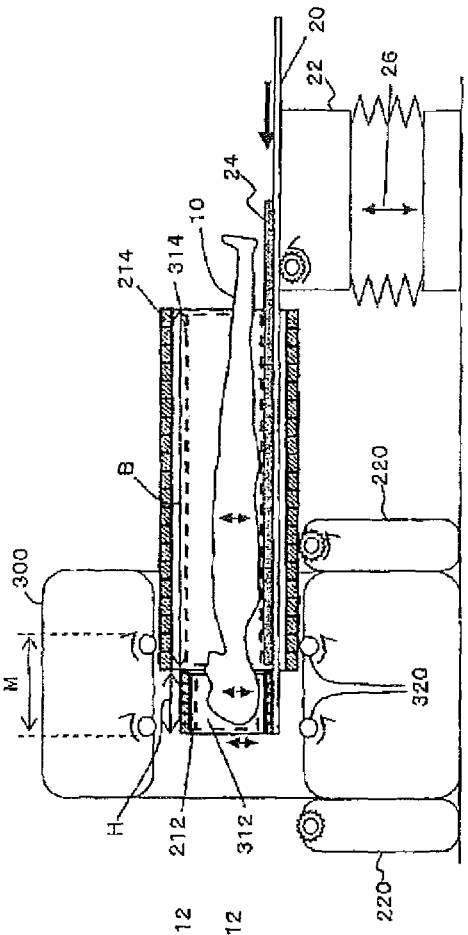
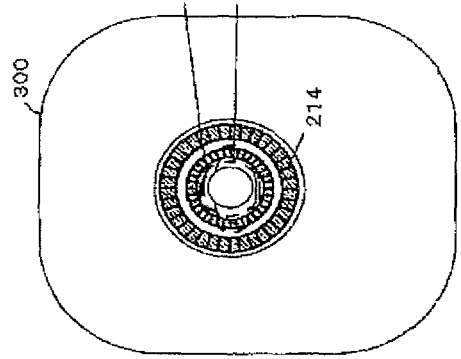

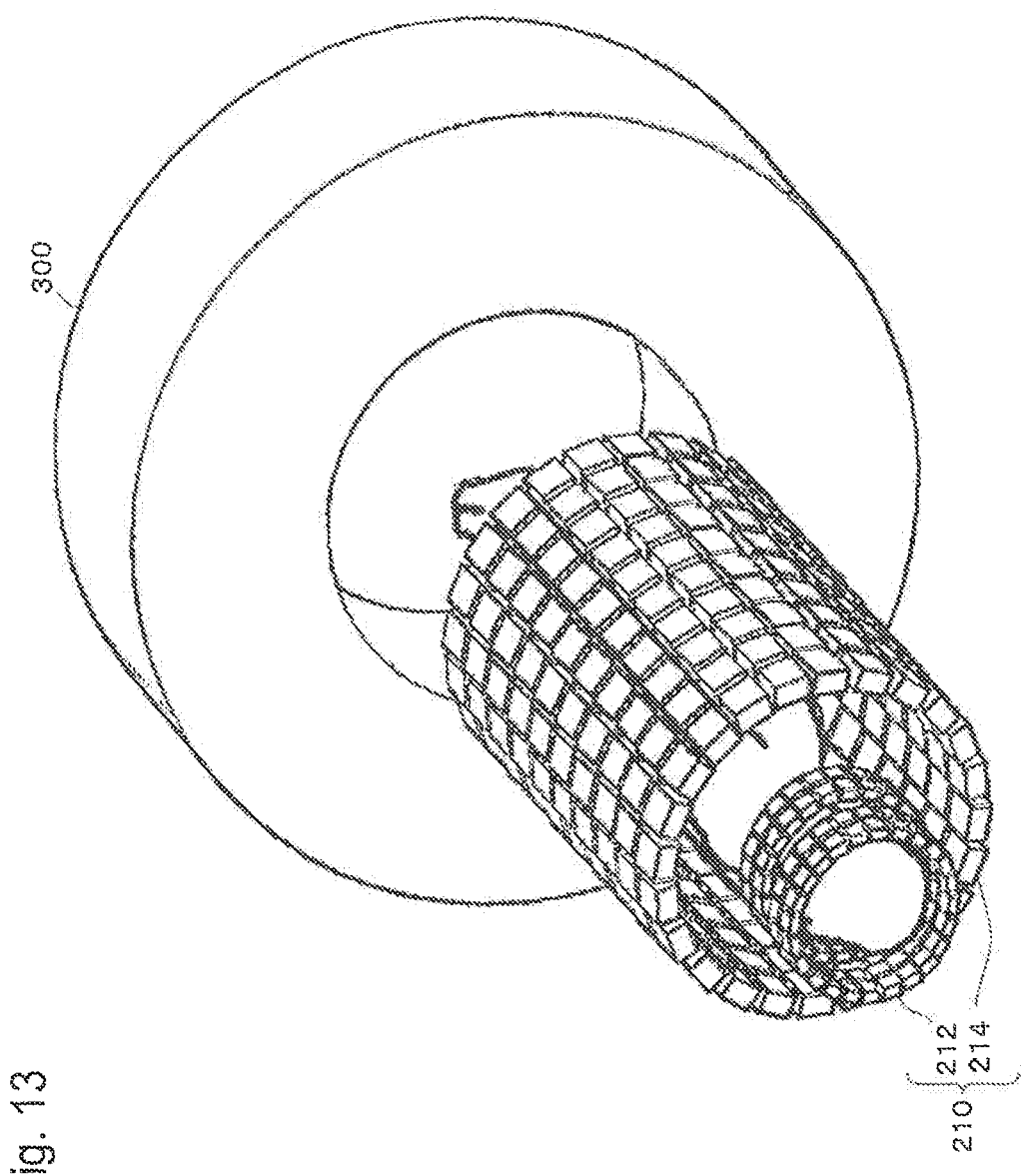

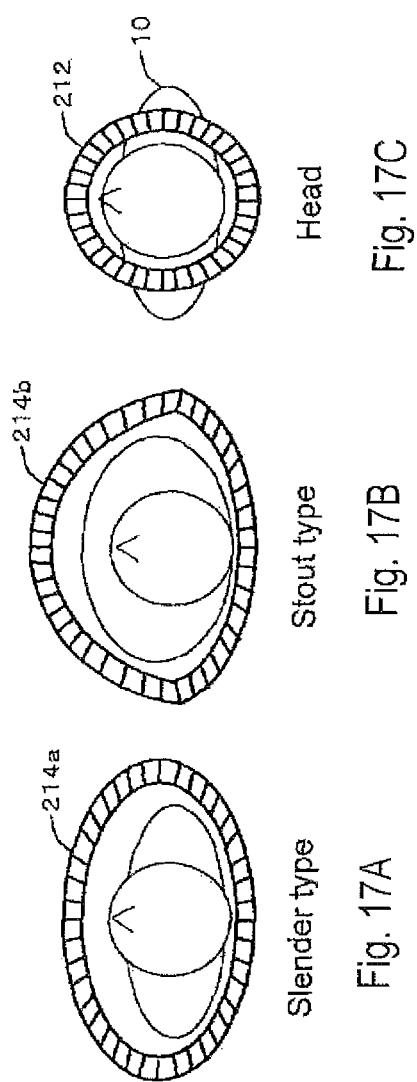

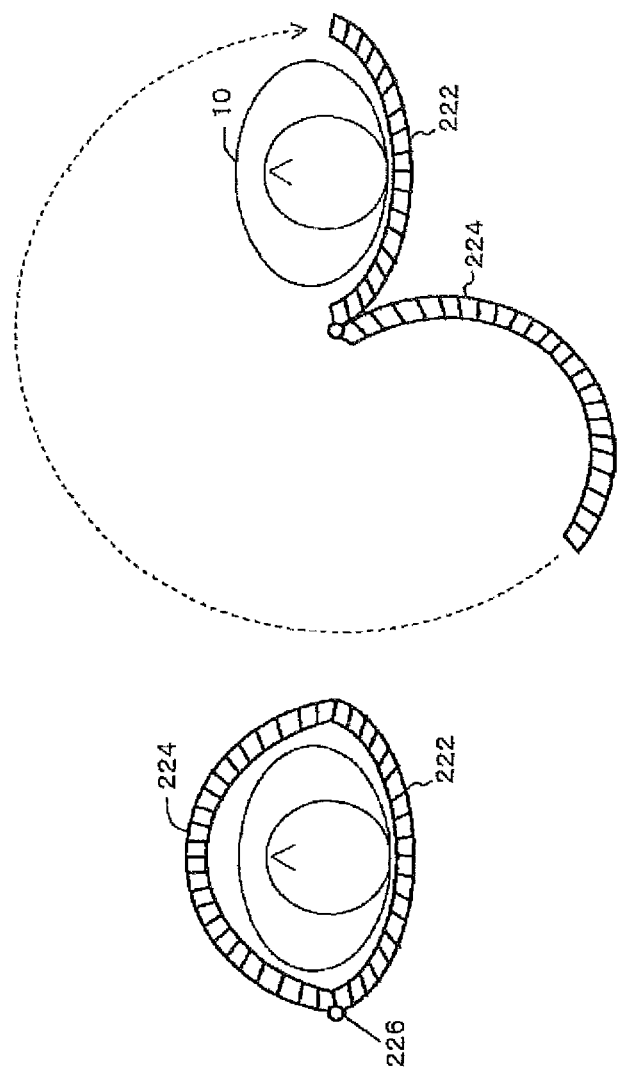

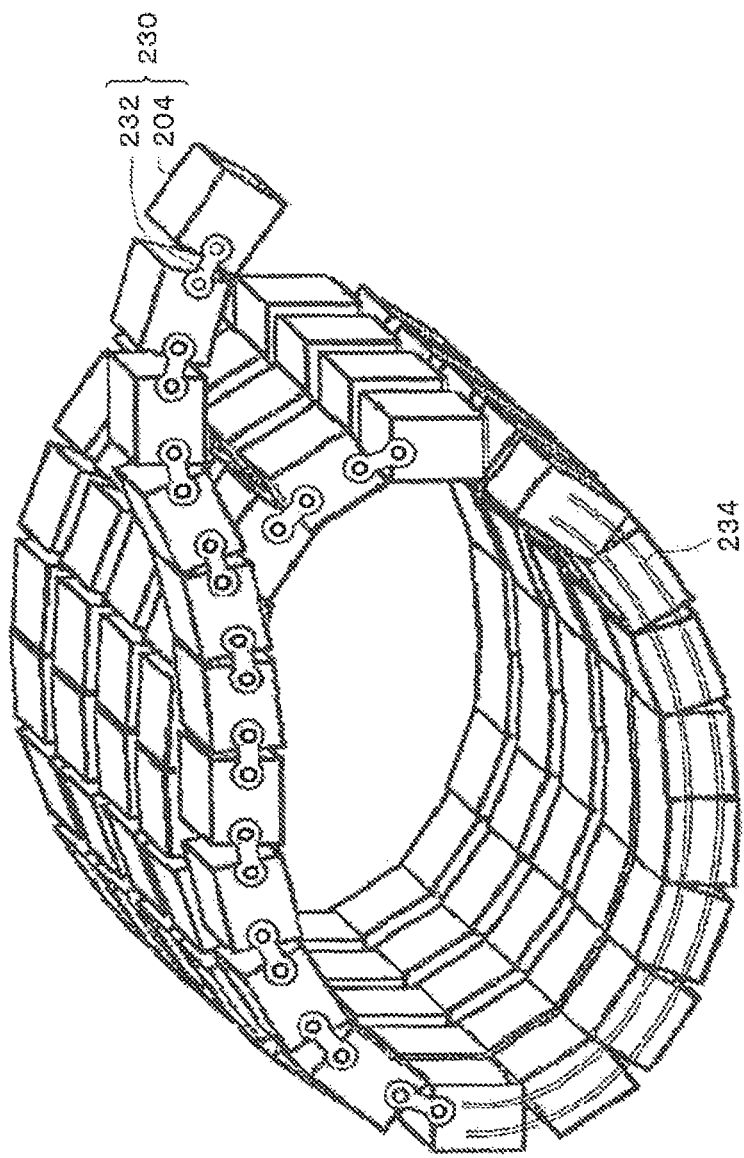

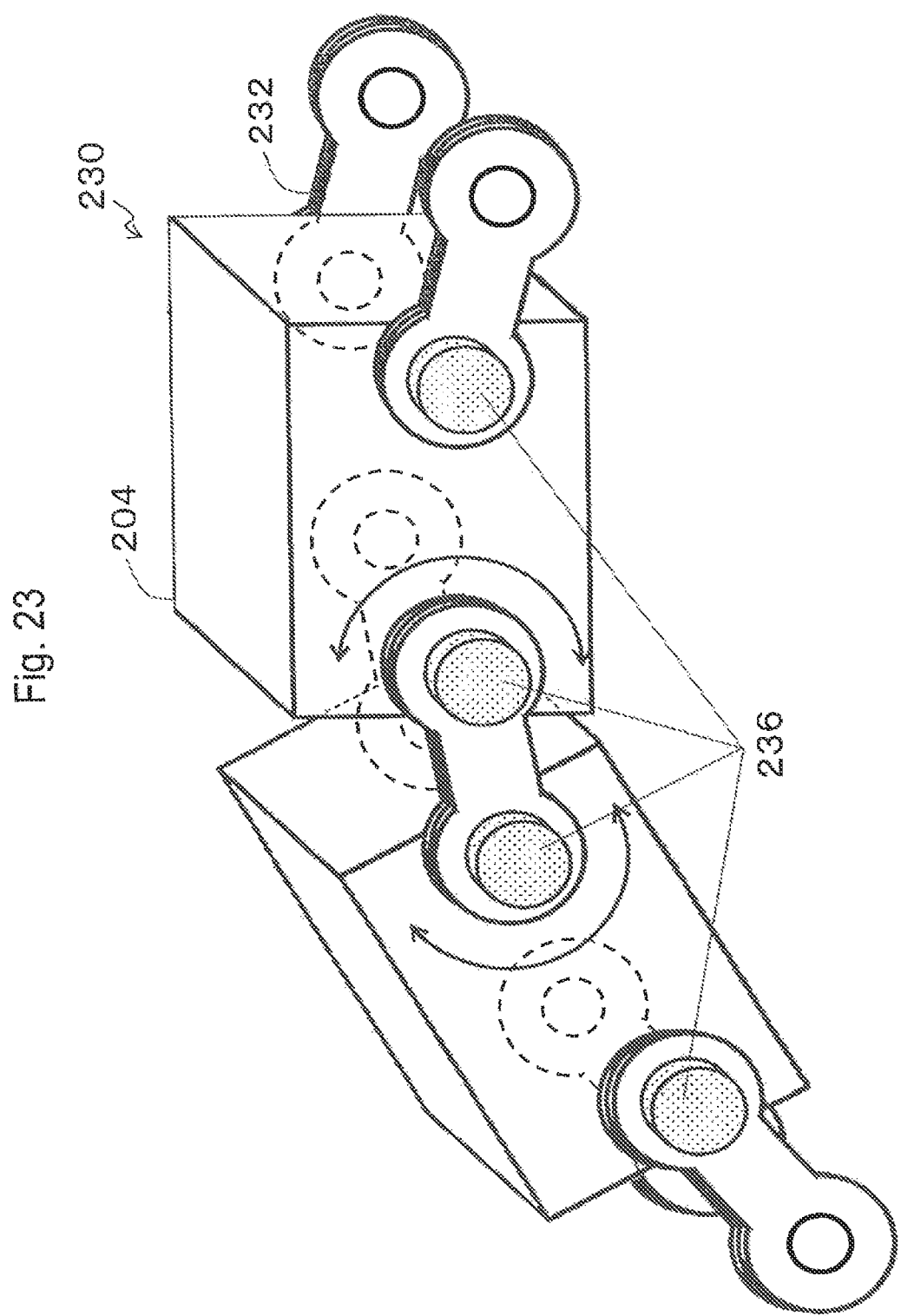

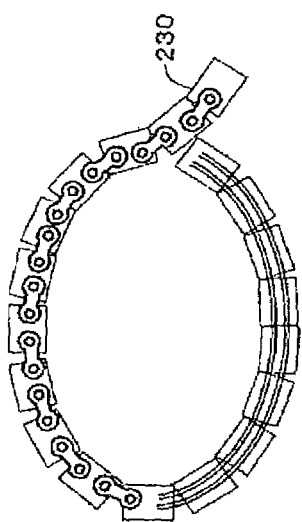
Fig. 25A Slender type
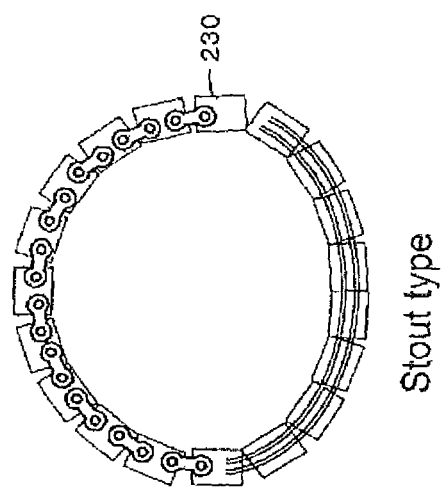
Fig. 25B Stout type

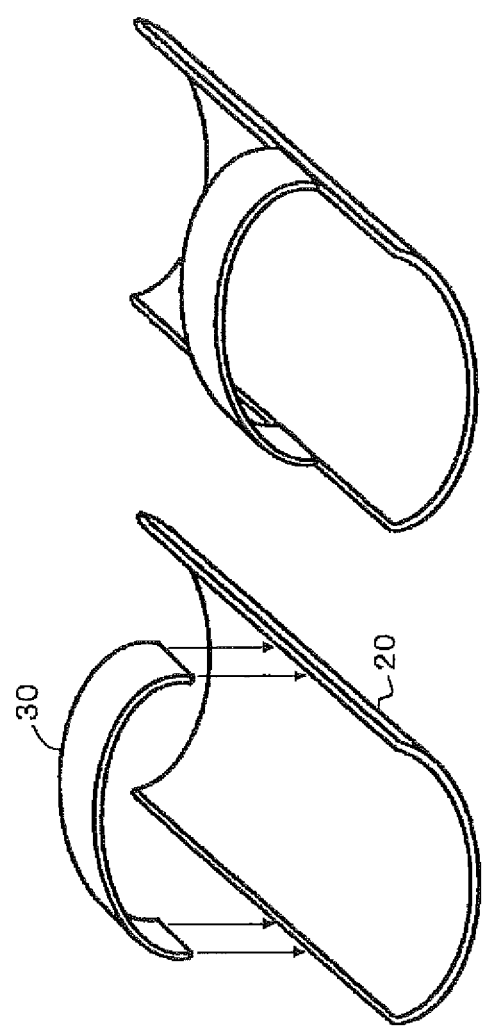

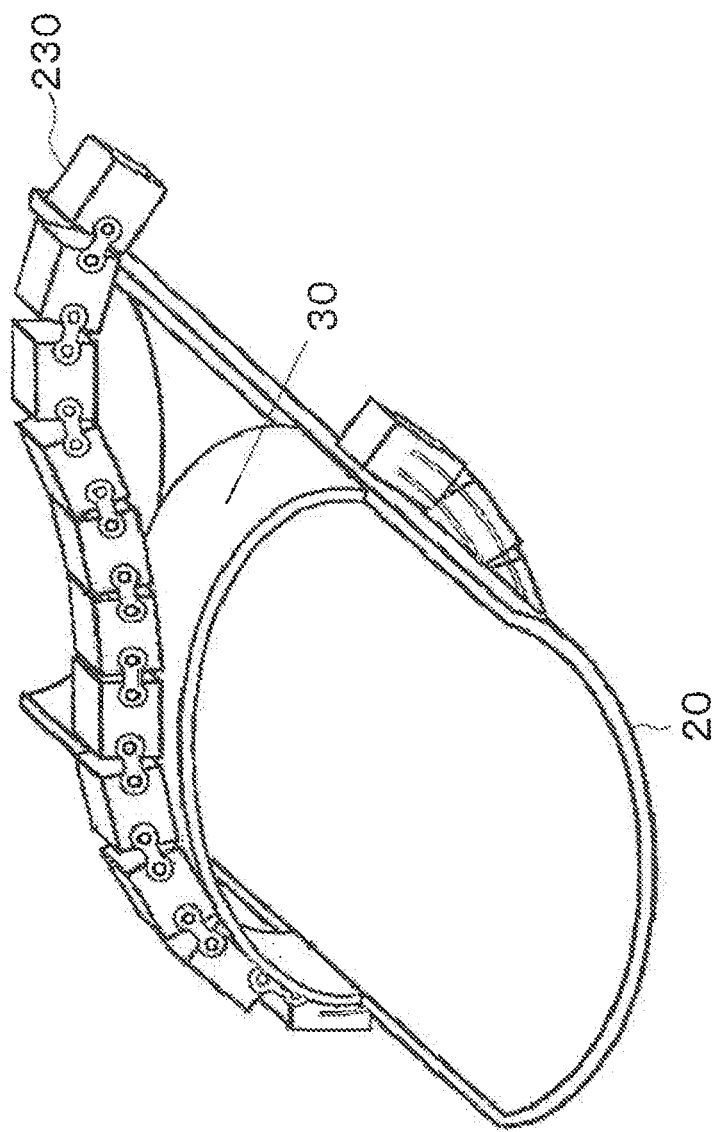

Slender type

Stout type

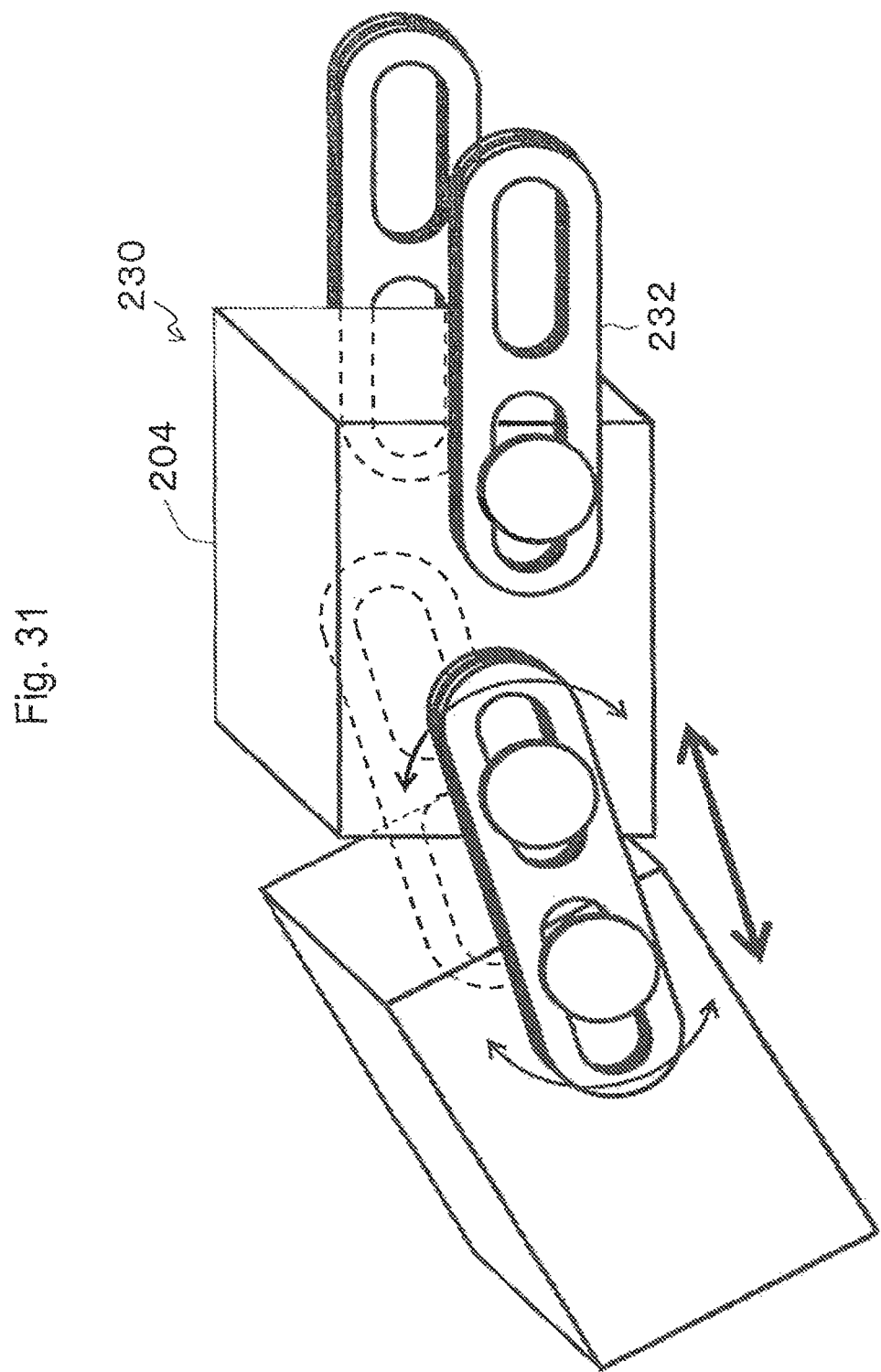

Slender type          Stout type

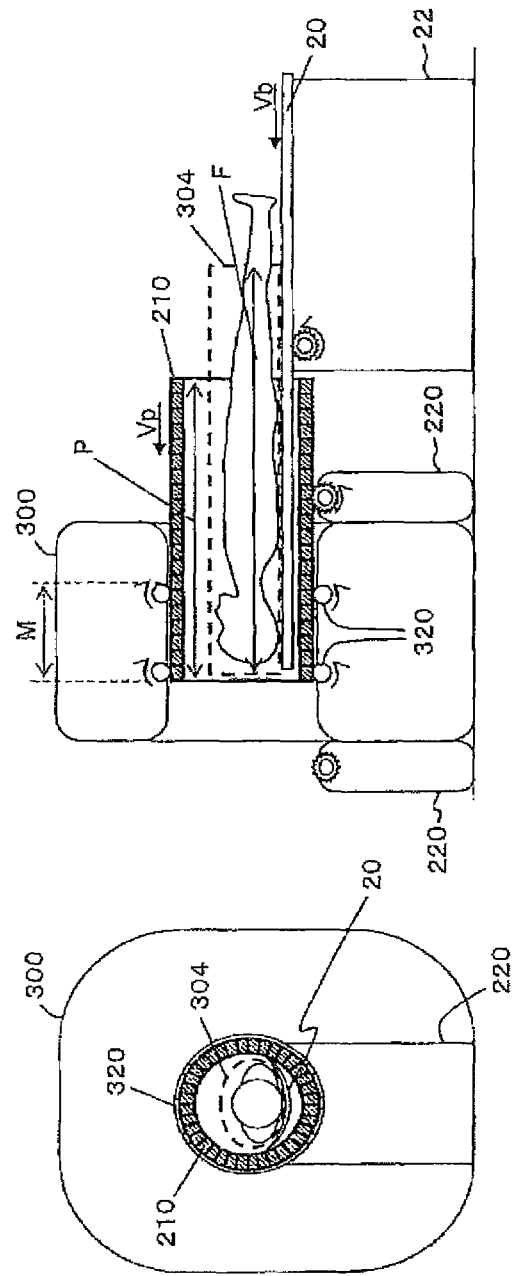

At the start of measurement

At the end of measurement

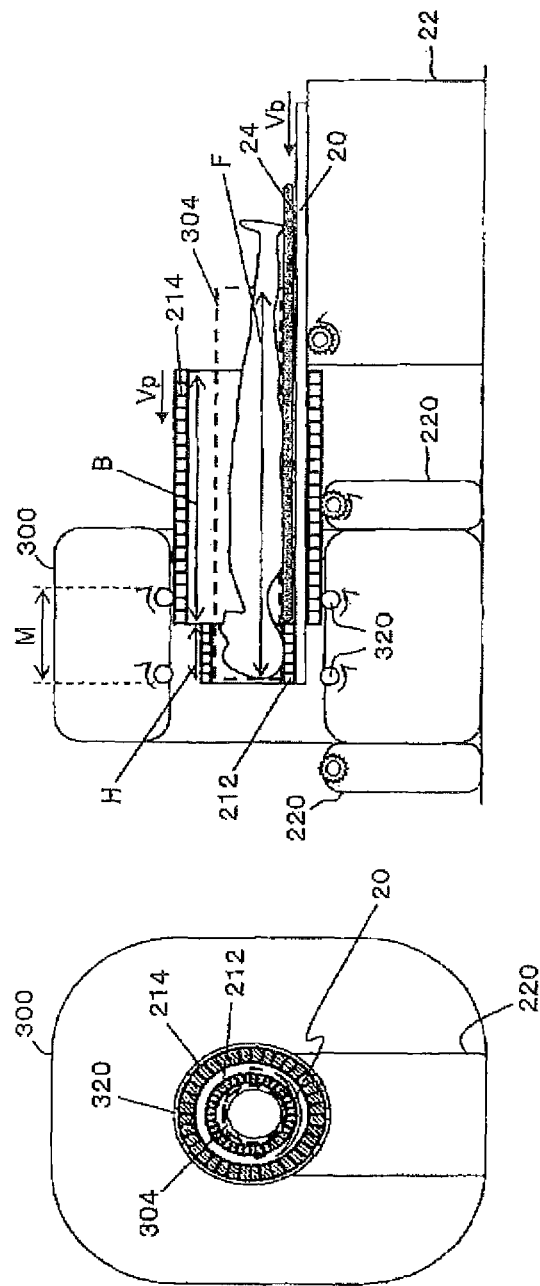

At the start of measurement

At the end of measurement

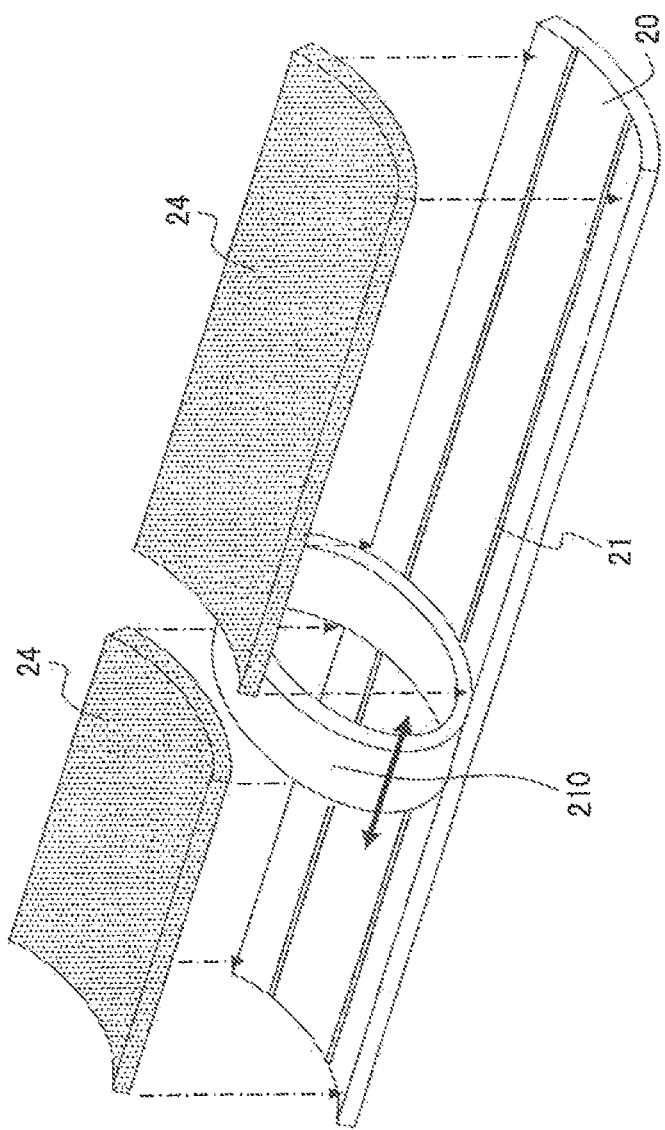

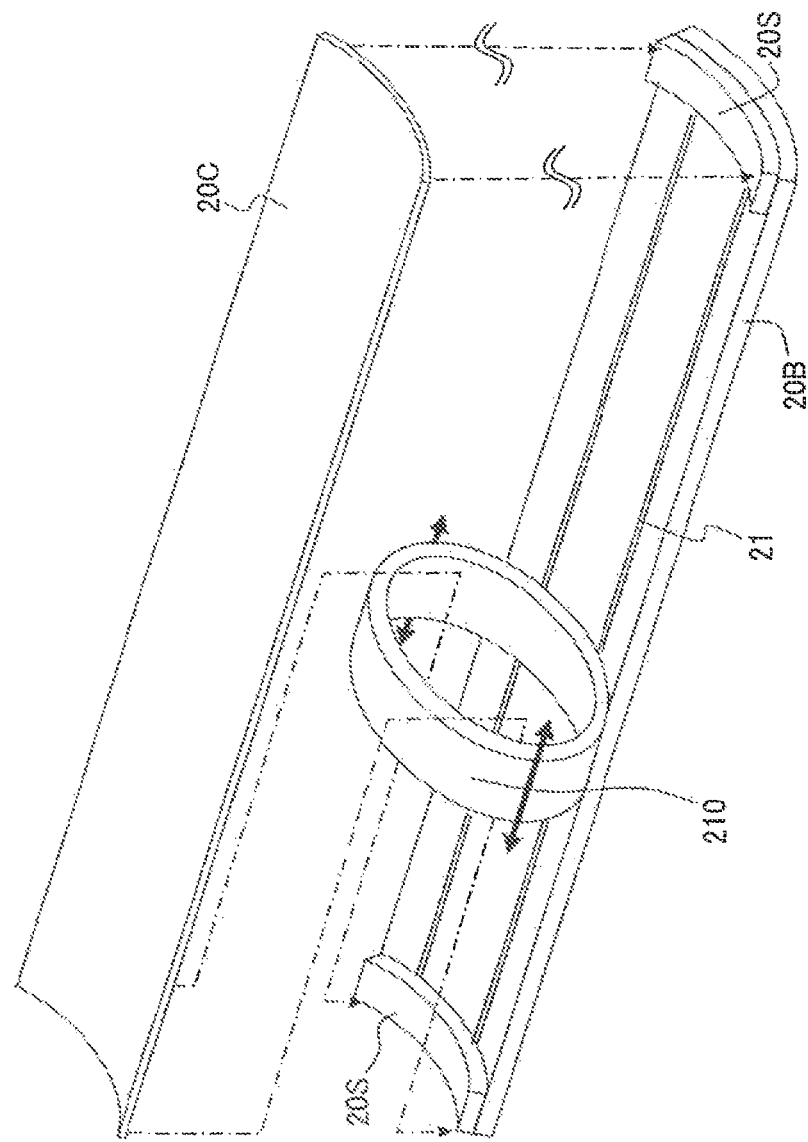

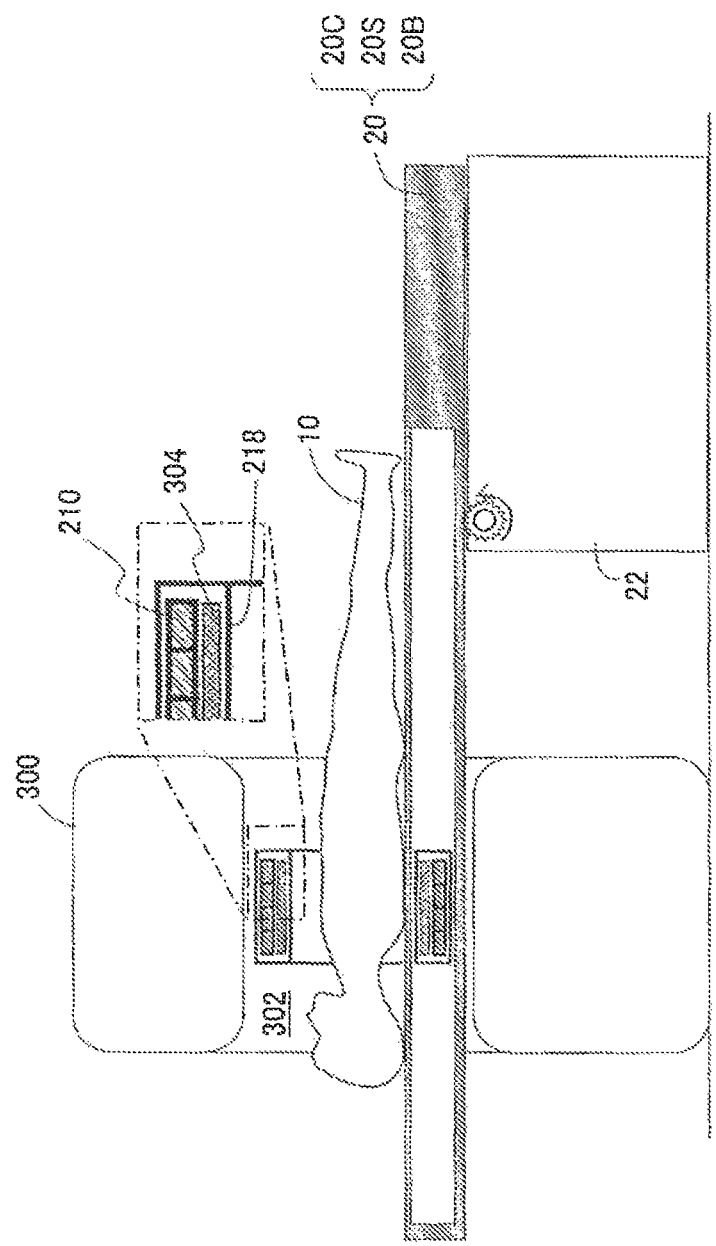

PET/MRI DEVICE, PET DEVICE, AND IMAGE RECONSTRUCTION SYSTEM

This is a Continuation of application Ser. No. 14/061,143 filed Oct. 23, 2013, which is a Division of application Ser. No. 12/959,893 filed Dec. 3, 2010, now abandoned, which claims the benefit of Japanese Patent Application No. JP 2010-52389 filed Mar. 9, 2010, now Japanese Patent No. 5598956. The disclosure of the prior applications are hereby incorporated by reference herein in their entirety.

BACKGROUND OF THE INVENTION

1. Field of the Invention

The present invention relates to a PET/MRI device and a PET device, and more particularly to a PET/MRI device that can obtain a PET image and an MRI image almost simultaneously in a short time, and a PET device whose PET detector can be brought close to a measurement object for improved sensitivity.

2. Description of the Related Art

PET/CT devices such as shown in FIGS. 1A and 1B have been in widespread use, in which a CT device 100 and a PET device 200 are combined to provide a functional image of the PET device 200 superposed on a morphological image of the CT device 100 for diagnosis. In the diagrams, 10 denotes a patient or subject (hereinafter, referred to generically as a patient) to be measured (tested); 20 denotes a bed on which the patient 10 is put (lies); 22 denotes a device for moving the bed 20 in a horizontal direction; 102 denotes an X-ray tube which is the X-ray source of the CT device 100; 104 denotes an X-ray detector; and 202 denoted detector rings (hereinafter, also referred to simply as rings) which constitute the PET detector of the PET device 200. The CT exposure is typically several times the PET exposure and is therefore not negligible.

Instead of the CT device, an MRI device which can obtain morphological images without radiation exposure is receiving attention. A PET/MRI device capable of obtaining both PET and MRI images has been under research and development. In particular, there has been developed a PET/MRI device of semiconductor light receiving element type in which all the detector units of the PET device are arranged within the static magnetic field of the MRI, using magnetically insensitive avalanche photodiodes (APDs) or Geiger mode APDs (also referred to as SiPMs) as the light receiving elements, and this PET/MRI device can be applied to those for small animals and for the heads (See the following non-patent and patent documents: Schlyer D et al. "A Simultaneous PET/MRI scanner based on RatCAP in small animals," IEEE Nuclear Science Symposium Conference Record, Volume: 5, pp. 3256-3259, 2007; Schlemmer H W et al. "Simultaneous MR/PET Imaging of the Human Brain: Feasibility Study," Radiology, 2008: 248, 1028-1035; Judenhofer M S et al. "Simultaneous PET-MRI: a new approach for functional and morphological imaging," Net Med 2008, 14(4): 459-65; U.S. Pat. No. 7,626,392 B2; U.S. Patent Application Laid-Open No. 2008/0287772 A1; and U.S. Patent Application Laid-Open No. 2009/0108206 A1).

Given detectors of the same sensitivity, the PET device typically increases in sensitivity as the detectors are located closer to the patient and as the field of view in the direction of the body axis of the patient (referred to as axial field of view) is widened. The axial field of view of the PET device as wide as the effective axial field of view of the MRI device (30 to 40 cm or so), which is determined by the stable area of the static magnetic field, has had the problem of insufficient sensitivity of the PET device, requiring a PET measurement time longer than the MRI measurement time (typically several minutes).

SUMMARY OF THE INVENTION

The present invention has been achieved in order to solve the foregoing conventional problem. It is thus a first object of the present invention to make it possible to obtain a PET image and an MRI image almost simultaneously in a short time.

A second object of the present invention is to improve the sensitivity of the PET detector.

The foregoing first object of the present invention has been achieved by the provision of a PET/MRI device including: an MRI device that has a measurement port; a PET detector that is insertable into the measurement port; and a mechanism that is capable of sliding the PET detector into and out of the measurement port of the MRI device, MRI measurement being allowed during PET measurement.

The PET detector may have a measurement field of view having a width wider than that of the MRI device in a longitudinal direction of a measurement object.

The PET detector may be movable through the measurement port with the measurement object.

The foregoing second object has been achieved by the PET detector being attached to a bed of the measurement object for integral movement.

The PET/MRI device may include a mechanism that is capable of sliding the PET detector in a longitudinal direction of the bed on which the measurement object is put.

An MRI RF coil may be attached to inside the PET detector.

The MRI RF coil attached to inside the PET detector may be a transmitter coil, a receiver coil, a transmitter-receiver two-way coil, or a coil that includes both a transmitter coil and a receiver coil.

The width of the measurement field of view of the PET detector may be extended to cover the measurement object at least from its head to its trunk.

The PET detector may be divided in the longitudinal direction of the measurement object.

Detector rings that constitute the PET detector, and/or detector units that constitute the detector rings, may be arranged at nonuniform intervals.

PET detectors having different resolutions and/or sensitivities may be used for the head and the trunk, respectively.

The PET detector for a head may have a resolution higher than that of the PET detector for a trunk.

The PET detector for the head may include a detector ring that has an inner diameter smaller than that of a detector ring that constitutes the PET detector for the trunk.

The PET detector may have an opening in at least an eye-covering area near the head of the measurement object.

A detector ring that constitutes the PET detector near a trunk of the measurement object may have a sectional shape such that its size in a thickness direction of the measurement object is different from that in a width direction perpendicular to the thickness direction so that the detector approaches a surface of the trunk.

The detector ring that constitutes the PET detector near the trunk of the measurement object may include an arched upper half portion and an arched lower half portion in the thickness direction of the measurement object, the arched upper half portion having a radius of curvature smaller than that of the arched lower half portion.

The detector ring that constitutes the PET detector may have a detector ring that has an arched upper half portion in the thickness direction of the measurement object, the arched upper half portion being openable at least in part.

The arched upper half portion may be opened in a double-door configuration.

The arched upper half portion may be opened in a single-door configuration.

The arched upper half portion and a remaining arched lower half portion may be separable from each other.

The detector ring that constitutes the PET detector may have an arched upper half portion in the thickness direction of the measurement object, the arched upper half portion being variable in size and/or in shape according to the measurement object.

The PET detector for a head may be movable with respect to and/or detachable from the PET detector for a trunk.

The PET measurement may be started before the PET detector starts being slid into the MRI measurement port, and ended after the PET detector ends being slid to a retracted position of the measurement object after end of the MRI measurement, whereby PET measurement time is maximized.

The PET detector may include a mechanism for sliding inside the measurement port independent of a sliding movement of the measurement object, so that the PET detector can slide at a moving speed lower than that at which the measurement object slides.

The PET/MRI device may include a slide mechanism that is capable of retracting the PET detector into the MRI measurement port so as to facilitate loading and unloading of the measurement object onto/from the bed and setup of the measurement object.

The PET measurement may be started immediately before start of the MRI measurement and ended immediately after end of the MRI measurement, or PET data that is collected from immediately before the start of the MRI measurement to immediately after the end of the MRI measurement may be used for PET image reconstruction processing, so as to improve simultaneity between the PET measurement and the MRI measurement.

The second object of the present invention has also been achieved by the attachment of a PET detector to a bed of a measurement object.

The present invention also provides a PET device including a belt-like PET detector that is composed of detector units connected by links, the detector units being freely changeable in layout according to a shape of a measurement object.

The links may have a function of allowing rotation and a change in distance between the detector units.

The links may include an encoder so that a relationship in spatial position coordinates between adjoining detector units is obtainable.

The PET device may include an inner frame so that the detector units constituting the belt-like PET detector are located in predetermined positions.

A plurality of types of the inner frame may be prepared in advance according to size and/or shape of the measurement object.

The present invention also provides an image reconstruction system which calculates a system matrix element for use in an image reconstruction operation by: referring to a relationship in spatial position coordinates between adjoining ones of detector units that are connected into a belt-like PET detector by links, the relationship being acquired from encoders attached to the links; referring to spatial position coordinates of the detector units constituting the belt-like PET detector, the coordinates being determined by an inner frame for locating the detector units in predetermined positions; or referring to spatial position coordinates of the detector units, determined by an arched upper half portion of the PET detector.

System matrices corresponding to respective layout patterns of the detector units may be calculated in advance and stored in a storing device, the layout patterns being uniquely determined by types of the inner frame or the arched upper half portion of the PET detector.

According to the present invention, it is possible to bring the PET detector close to the patient and/or make the effective measurement field of view of the PET detector wider than that of the MRI device, so that a PET image and an MRI image are obtained almost simultaneously in a short time.

The PET detector can be attached to the bed of the measurement object so that the PET detector comes closer to the measurement object for even higher sensitivity.

BRIEF DESCRIPTION OF THE DRAWINGS

FIG. 3A is a front view and FIG. 3B is a sectional view seen from a side, showing a detailed configuration of the same;

FIGS. 5A and 5B are flowcharts showing operating procedures of the same;

FIG. 11A is a front view and FIG. 11B is a sectional view seen from a side, showing a detailed configuration of a third embodiment of the present invention;

FIG. 13 is a perspective view showing a general configuration of a sixth embodiment of the present invention;

FIGS. 17A, 17B, and 17C are cross-sectional views showing the layout of the PET detectors for slender type, stout type, and the head, respectively;

FIGS. 20A and 20B are cross-sectional views showing the configuration and operation of a modification of the eighth embodiment;

FIG. 22 is a perspective view showing the configuration of essential parts of a tenth embodiment of the present invention;

FIG. 23 is a perspective view showing the configuration of essential parts of a belt-like PET detector used in the tenth embodiment;

FIGS. 25A and 25B are cross-sectional views showing examples of the layout of the belt-like PET detector;

FIGS. 26A and 26B are perspective views showing the configuration and operation of essential parts of an eleventh embodiment of the present invention;

FIG. 28 is a perspective view showing the state where the belt-like PET detector of the eleventh embodiment is being attached to an inner frame;

FIG. 31 is a perspective view showing the configuration of joints of the same;

FIG. 37A is a front view and FIG. 37B is a sectional view seen from a side, showing the overall configuration of a fifteenth embodiment of the present invention;

FIG. 39A is a front view and FIG. 39B is a sectional view seen from a side, showing the overall configuration of a sixteenth embodiment of the present invention;

FIG. 43 is a perspective view showing the configuration of essential parts of a nineteenth embodiment of the present invention;

FIG. 44 is a perspective view showing the configuration of essential parts of a twentieth embodiment of the present invention;

FIG. 45 is a sectional view seen from a side, showing the overall configuration of the same.

DETAILED DESCRIPTION OF THE PREFERRED EMBODIMENTS

Hereinafter, embodiments of the present invention will be described in detail with reference to the drawings.

Figure 1:
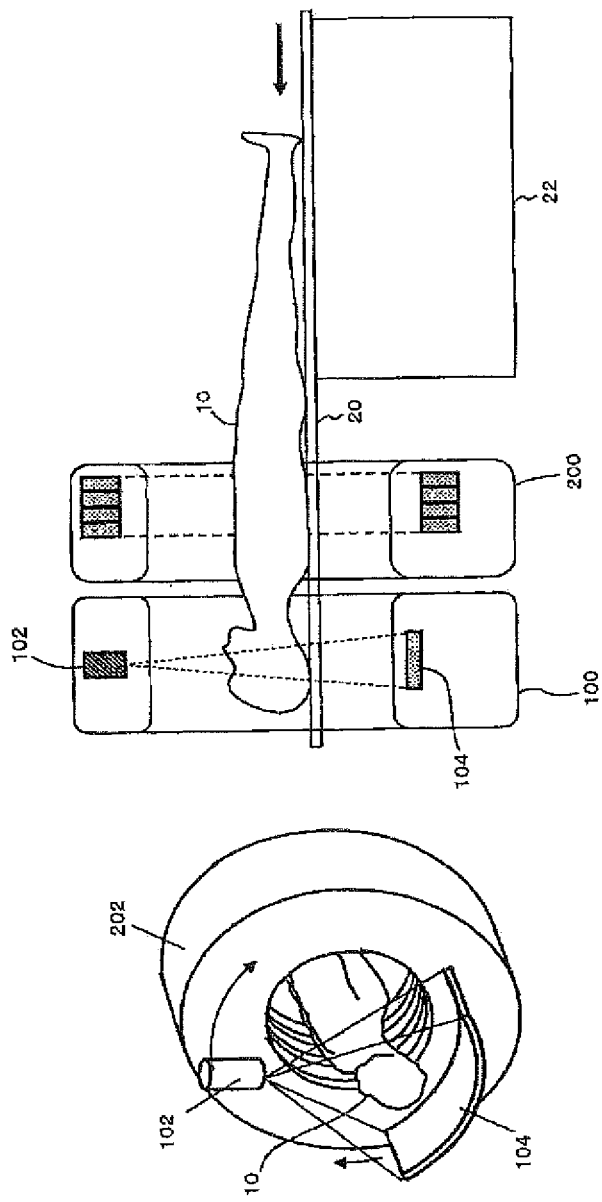
FIG. 1A is a perspective view and FIG. 1B is a sectional view seen from the front, showing the configuration of an example of a conventional PET/CT device.
Figure 2:
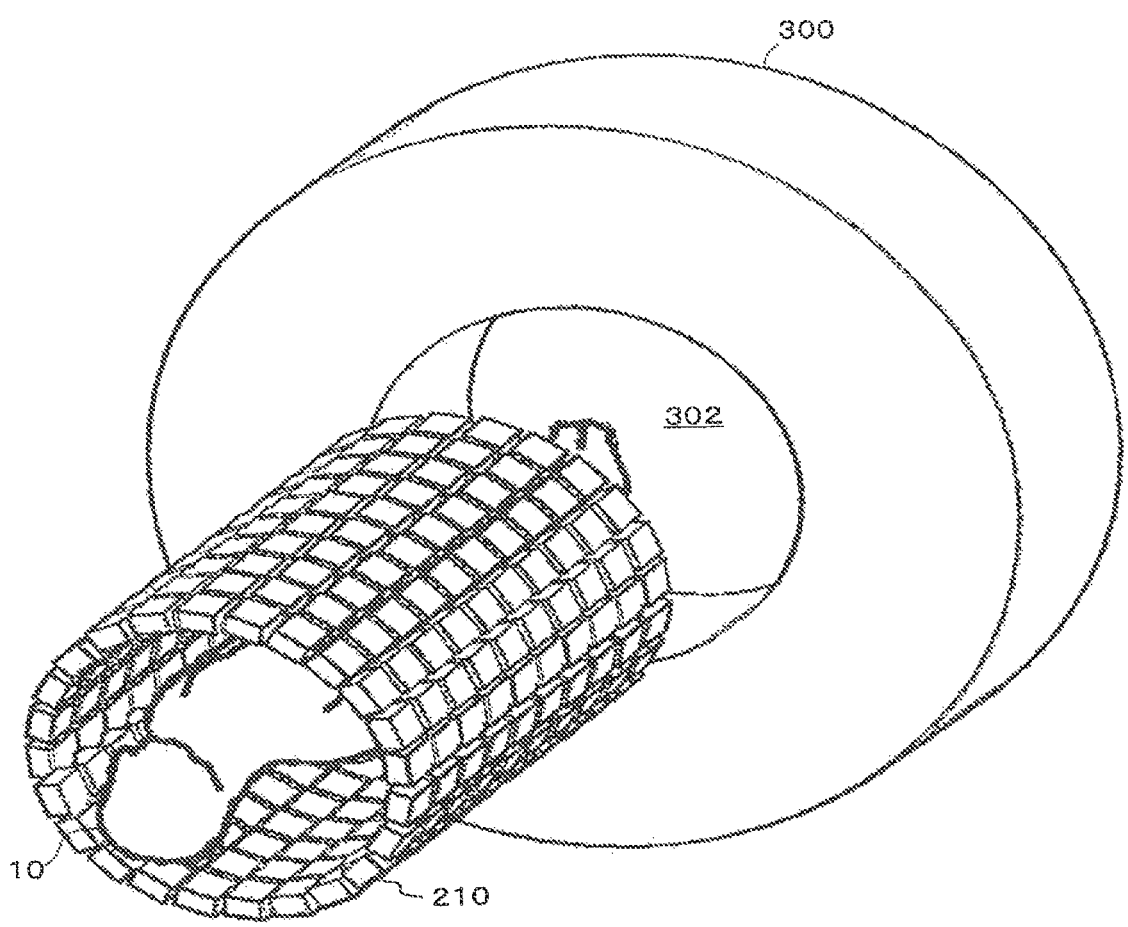
FIG. 2 is a perspective view showing a general configuration of a first embodiment of the present invention.

As shown in FIG. 2 (a perspective view for overview), FIG. 3A (a front view), and FIG. 3B (a sectional view seen from a side), a first embodiment of the present invention includes an MRI device 300 and a PET detector 210. The MRI device 300 has a measurement port (here, a patient port) 302. The PET detector 210 has an outer diameter smaller than the inner diameter of the patient port 302, and can move through the patient port 302 with a measurement object (here, a patient) 10. The PET detector 210 has an effective measurement field of view (referred to as a PET field of view) P wider than the effective measurement field of view (referred to as MRI field of view) M of the MRI device 300, thereby allowing MRI measurement during PET measurement. In the diagrams, 24 denotes a cushion for protecting the patient 10, and 304 denotes an RF coil for the MRI device 300. The RF coil 304 may be integrated with the cushion 24 at the back side of the patient.

The MRI field of view M is determined by the area where the static magnetic field is stable, which is typically 30 to 40 cm or so. The PET field of view P can be extended to improve the sensitivity of the PET measurement. A PET image of sufficient image quality can thus be obtained in a PET measurement time comparable to the MRI measurement time.

The PET detector 210 is capable of stable operation in the MRI magnetic field environment. Examples include APD-bottomed scintillator blocks, and a Depth-of-Interaction (DOI) detectors having a three-dimensional array of semiconductor light receiving elements on the surface of a three-dimensional array of small scintillator elements, which has been proposed by the inventors in Japanese Patent Application Laid-Open No. 2009-121929 and in Y. Yazaki, H. Murayama, N. Inadama, A. Ohmura, H. Osada, F. Nishikido, K. Shibuya, T. Yamaya, E. Yoshida, T. Moriya, T. Yamashita, and H. Kawai, "Preliminary study on a new DOI PET detector with limited number of photo-detectors," The 5th Korea-Japan Joint Meeting on Medical Physics, Sep. 10-12, 2008, Jeju, Korea, YI-R2-3, 2008. DOI detectors can be used to suppress a drop in resolution even in close proximity. The closer access can also reduce resolution degradation due to angular deviations, as well as increase the solid angle to improve the sensitivity even with a relatively small number of detectors.

In the present embodiment, the PET detector 210 is integrated with a bed 20. That is, part of the PET detector 210 also functions as a bed. Since the PET detector can be brought closest to the patient, the solid angle increases for improved sensitivity and fast measurement.

The RF coil 304 is installed so as to cover the PET field of view P and most of the axial field of view. The RF coil 304 is arranged inside (within the inner diameter of) the PET detector 210 since the closer the RF coil 304 is to the patient 10, the higher the signal S/N ratio becomes. Another reason is to prevent electrical noise and the like from the PET detector 210. The RF coil is highly transparent to annihilation radiations. The presence of the RF coil 304 thus has only a limited impact on the PET measurement.

The bed 20 may be moved by a bed moving device 22 at constant speed or step by step.

Figure 4A:
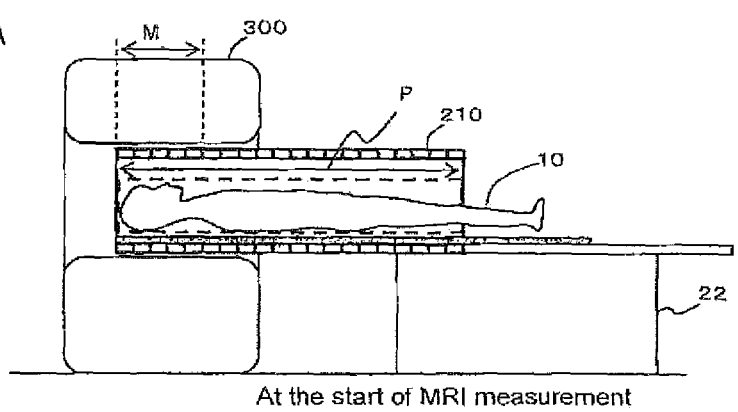
FIGS. 4A and 4B are sectional views showing a typical operation of the same.
Figure 4B:
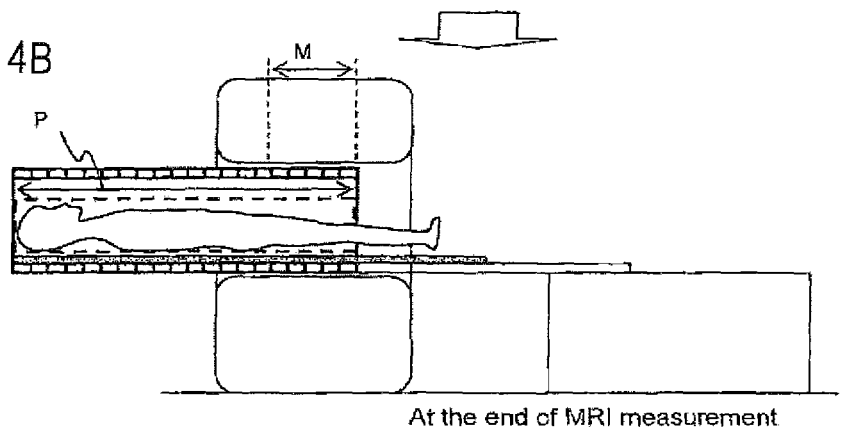

FIG. 4A shows the state at the start of the MRI measurement. FIG. 4B shows the state at the end of the MRI measurement. In FIGS. 4A and 4B, the moving speed Vb of the bed, if constant, is given by Vb=(P−M)/Tm. Tm is the MRI measurement time.

FIG. 5A shows a procedure in which the PET measurement time Tp is maximized to increase the data collection time for improved PET image quality. FIG. 5B shows a procedure in which the PET measurement is started immediately before the start of the MRI measurement and ended immediately after the end of the MRI measurement, or PET data that is collected from immediately before the start of the MRI measurement to immediately after the end of the MRI measurement is used for PET image reconstruction processing. Such a procedure makes the PET measurement time and the MRI measurement time almost equal, thereby ensuring simultaneity between the PET measurement and the MRI measurement. For a breath-held shot, the procedure of FIG. 5B is preferred.

Figure 6:
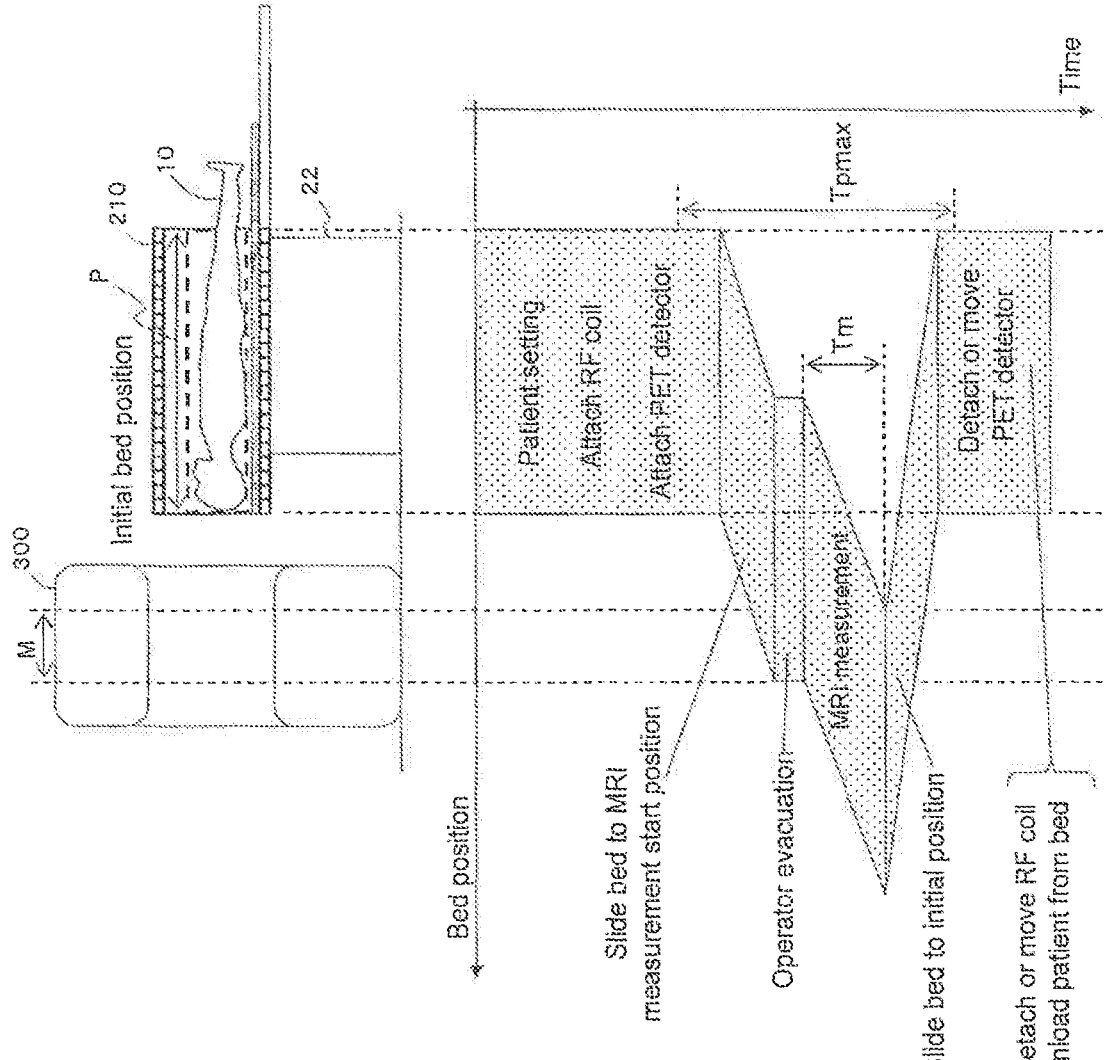
FIG. 6 is a time chart of the same.

FIG. 6 shows the time chart. For the bed position, the positions of the front and rear ends of the bed are plotted. Suppose that the PET medicine has been administered to the patient in advance. In FDG-PET, it is typically administered an hour earlier.

In FIG. 6, the maximum value Tpmax of the PET measurement time shows a difference in time between when the PET detector 210 is attached in place and when the PET detector 210 is detached or moved.

The actual Tp is determined by the following formula:

$$Tm \leq Tp \leq Tpmax. \quad (1)$$

According to the procedure of FIG. 5A, Tp approaches Tpmax. With the procedure of FIG. 5B, Tp approaches Tm.

The MRI measurement start position and the MRI measurement end portion need not necessarily be set at the respective ends of the MRI field of view M. For example, as in a modification shown in FIG. 7, the MRI measurement start position and the MRI measurement end position both may be at the center of the MRI field of view where a favorable magnetic field is formed.

Figure 7:
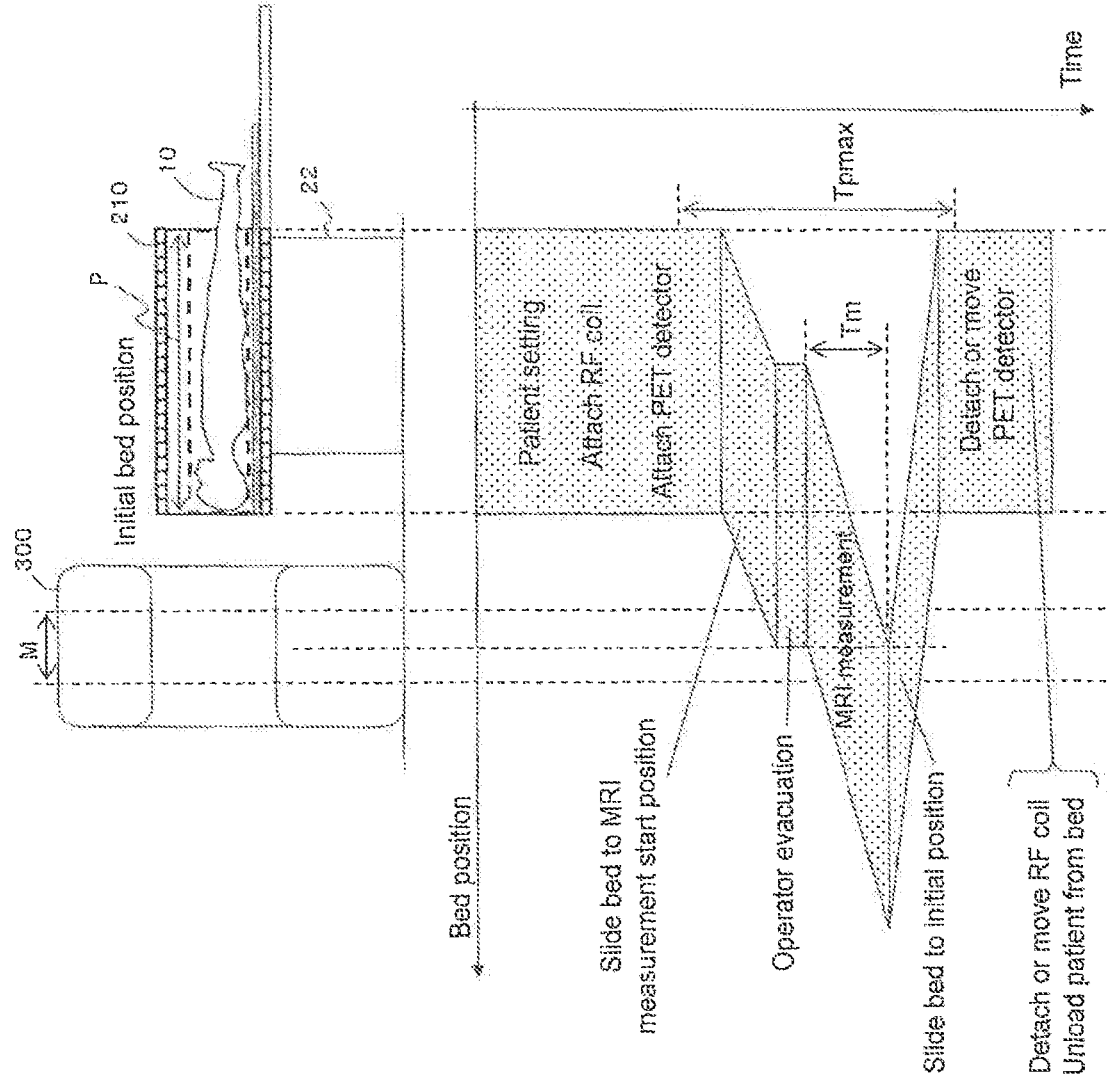
FIG. 7 is a time chart of a modification of the same.
Figure 8:
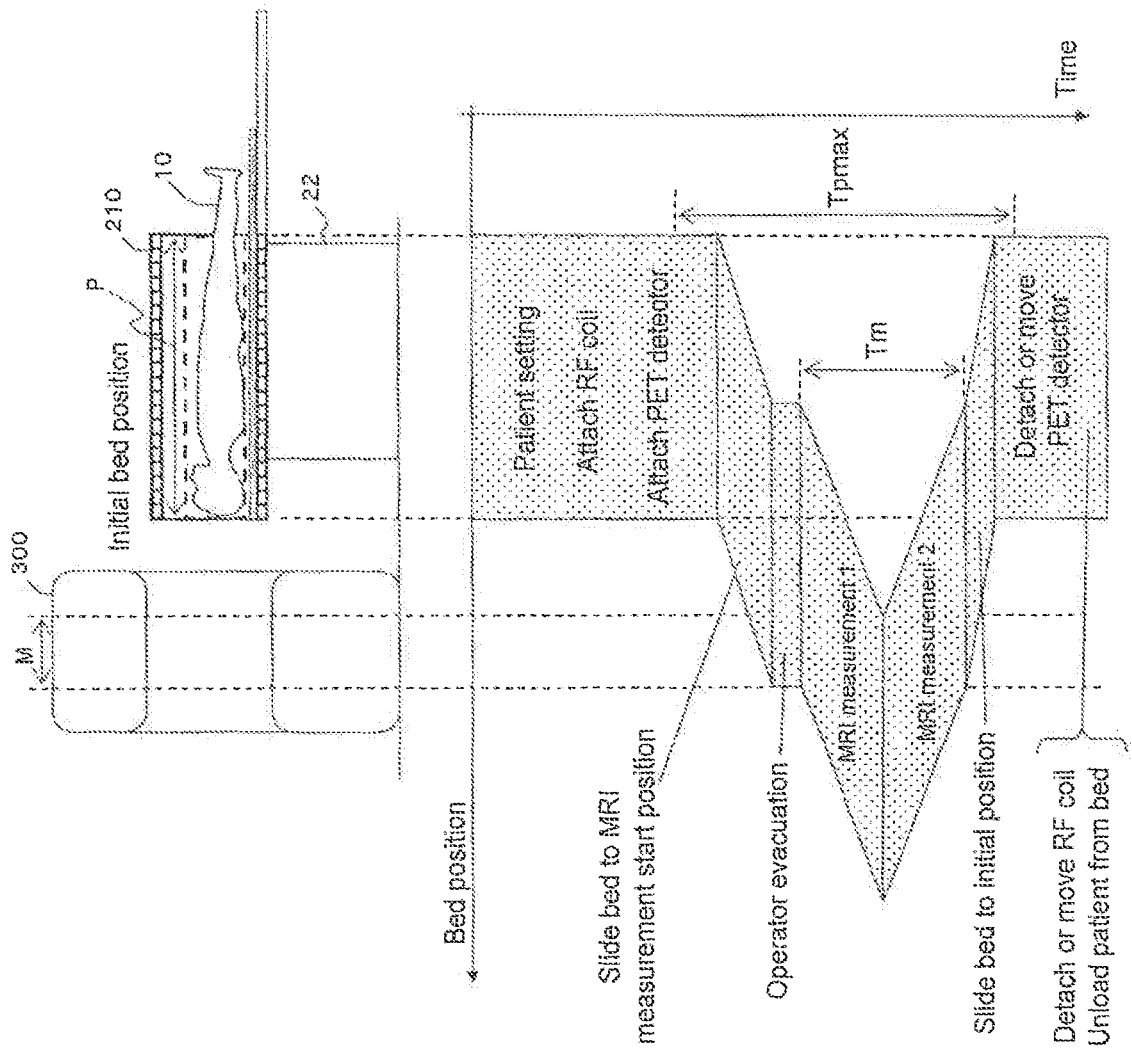
FIG. 8 is a time chart of another modification of the same.

As shown in FIGS. 6-8, the PET detector may be stopped from sliding for operator evacuation prior to the MRI measurement, and then the sliding of the PET detector would be restarted as the MRI measurement is started.

During the MRI measurement, the bed may be slid step by step, not at constant speed.

In FIGS. 6 and 7, the MRI measurement is performed while the bed is moving on one way. However, as in another modification shown in FIG. 8, the MRI measurement may be performed on both ways of the reciprocating movement. In such a case, MRI measurement 1 onward and MRI measurement 2 on the return may be performed by the same sequence. Different sequences may be combined, for example, so that MRI measurement 1 is T1-weighted and MRI measurement 2 is T2-weighted.

Figure 9B:
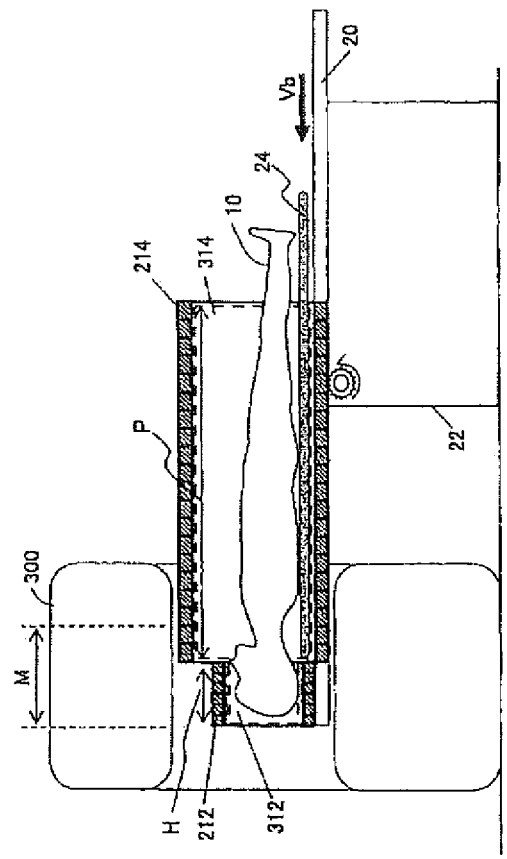
FIG. 9B is a sectional view seen from a side, showing a detailed configuration of the same.
Figure 9A:
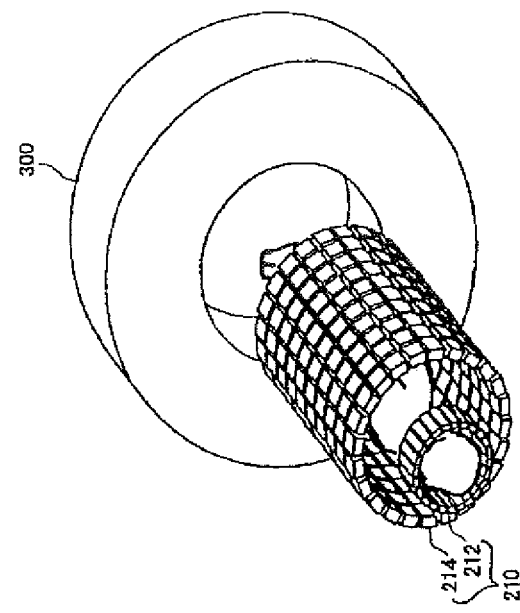
FIG. 9A is a perspective view showing a general configuration of a second embodiment of the present invention.
Figures 10A, 10B:
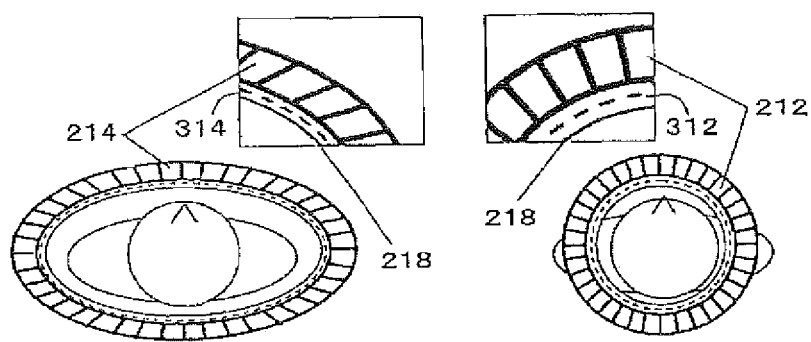
FIGS. 10A and 10B are cross-sectional views of the same, showing a state where an RF coil is attached.

The foregoing first embodiment has dealt with the case where the PET detector 210 has a uniform configuration in the longitudinal direction of the measurement object, or the direction of the body axis of the patient 10 here. As in a second embodiment shown in FIG. 9A, the PET detector 210 may be divided into a head PET detector 212 and a trunk or body PET detector 214. FIG. 9B shows a sectional view of a concrete example of the second embodiment seen from a side. FIGS. 10A and 10B show cross-sectional views of the body and head portions of the PET detector. The body PET detector has an elliptical cross section, whereas it may be circular.

In the present embodiment, the head PET detector 212 and the body PET detector 214 are fixed to the bed 20 so that they can be horizontally moved with the patient 10 by the bed moving device 22.

Coincidence measurement between the head PET detector 212 and the body PET detector 214 can prevent a drop in the accuracy of the reconstructed image near the border between the head PET detector 212 and the body PET detector 214.

The head PET detector 212 and the body PET detector 214 may be spaced apart by using the technology of the open PET device that the inventors have proposed in WO 2009/133628 A1. In the absence of the space as in FIGS. 9A and 9B, the PET field of view P equals to the head field of view H+the body field of view B.

The RF coil may be a transmitter-receiver two-way coil, a transmitter coil, or a receiver coil. The RF coil and the PET detector may be formed as separate members. When the RF coil and the PET detector are integrated as shown in FIGS. 10A and 10B, the following combinations are possible:

A transmitter-receiver two-way RF coil is integrated into inside the PET detector.

Only a transmitter RF coil is integrated into inside the PET detector, and a receiver RF coil is separately arranged so as to cover the patient.

A transmitter RF coil is built in the main unit of the MRI device, and only a receiver RF coil is integrated into inside the PET detector.

In FIGS. 10A and 10B, 218 denotes a cover, 312 denotes a head RF coil, and 314 denotes a body RF coil.

FIG. 11A is a front view showing a concrete example of a third embodiment which is a modification of the second embodiment. FIG. 11B is a sectional view seen from a side.

In the present embodiment, the head PET detector 212 is fixed to the bed 20. The body PET detector 214 can be horizontally moved by a PET detector moving device 220, independent of the bed 20. In the diagrams, 320 designates rollers that support the PET detector 214 in the patient port 302.

The head PET detector 212 and the body PET detector 214 have different center positions in the patient port 302 of the MRI device 300. The bed moving device 22 may include a bed up-down mechanism 26 so that the head PET detector 212 and the head RF coil 312 can be slid and moved up and down with the patient 10. The body PET detector 214 and the body RF coil 314 are only moved to slide horizontally, without up and down movements.

Figure 12A:
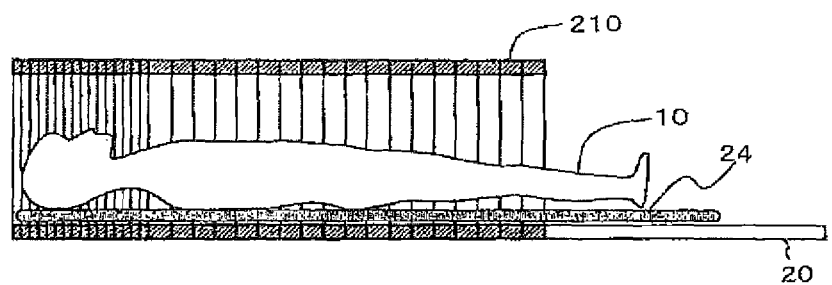
FIG. 12A is a sectional view seen from a side, showing the configuration of essential parts of a fourth embodiment, and FIG. 12B a fifth embodiment, of the present invention.
Figure 12B:
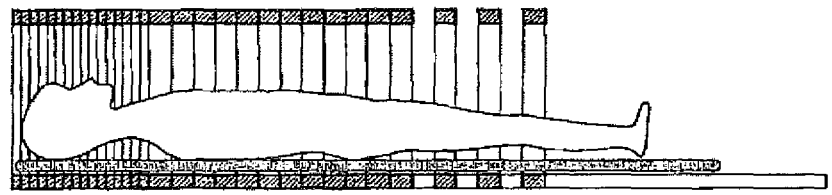

The PET detector may be made of a combination of detectors of different resolutions depending on the locations. FIG. 12A shows a fourth embodiment in which high-resolution detectors are arranged in the vicinity of the head where high resolution is needed. FIG. 12B shows a fifth embodiment with a reduced number of detectors, in which the detectors are spaced wider, instead of the sensitivity being lowered, for the lower body or the legs in particular where not so high sensitivity is needed.

Figure 14:
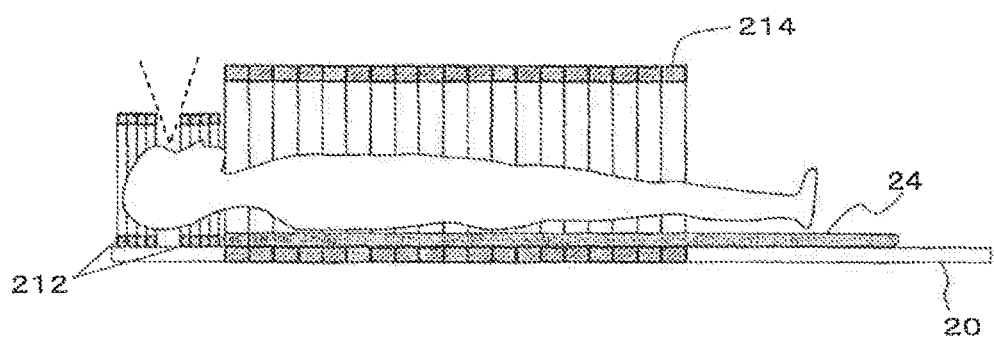
FIG. 14 is a sectional view of the same seen from a side.

As in a sixth embodiment shown in FIG. 13 (a perspective view) and FIG. 14 (a sectional view seen from a side), the technology of the open PET device may be used to form an open area in the head PET device 212 in the vicinity of the field of view so as to alleviate the sense of confinement on the head.

Figure 15:
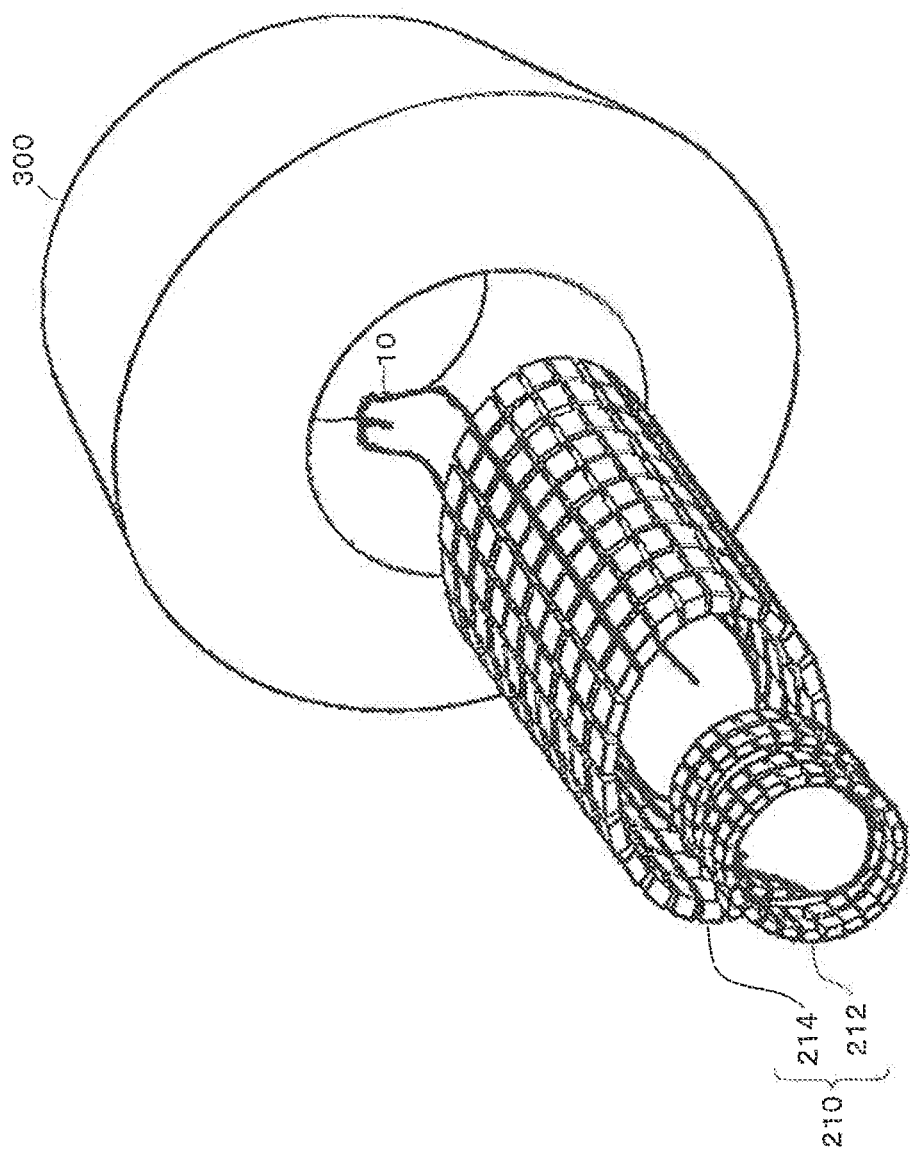
FIG. 15 is a perspective view showing a general configuration of a seventh embodiment of the present invention.

As in a seventh embodiment shown in FIG. 15, the body PET detector 214 may be made of noncircular (in the diagram, elliptical) rings so that the PET detector comes closer to the patient's body.

Figure 16A:
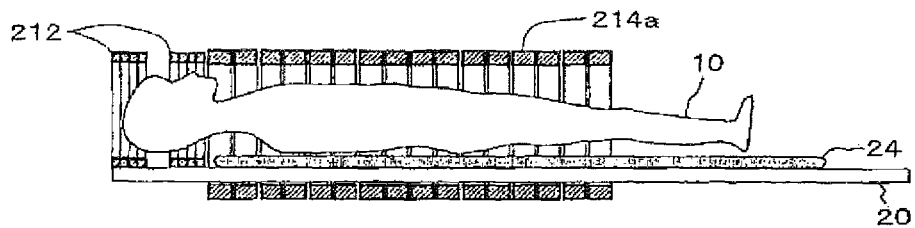
FIGS. 16A to 16C are longitudinal sectional views showing the configuration of essential parts of the seventh embodiment.
Figure 16B:
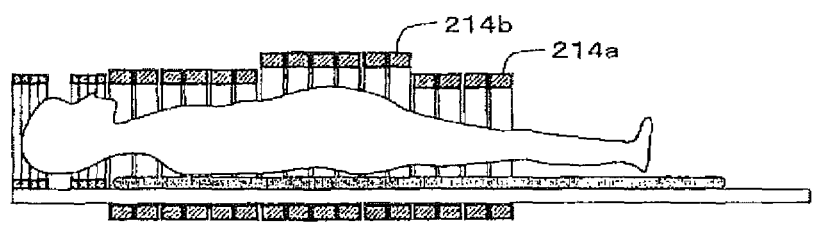
Figure 16C:
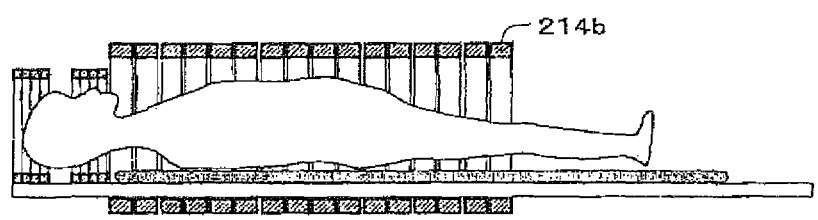

FIGS. 16A to 16C show the configuration of essential parts where the detector rings can be changed in size according to the body type of the patient 10. FIG. 16A shows an example where normal-sized detector rings 214a are used. FIG. 16B shows an example where large-diametered detector rings 214b are used for the abdomen. FIG. 16C shows an example where the large-diametered detector rings 214b are used not only for the abdomen but for the entire body.

FIGS. 17A to 17C show the cross sections of FIGS. 16A to 16C. FIG. 17A shows a PET detector layout for slender type, FIG. 17B shows a PET detector layout for stout type, and FIG. 17C shows a PET detector layout for the head. In the PET detector layout for stout type of FIG. 17B, the arched half portion of the detector on the bed side (lower side in the thickness direction) and that on the opposite side (upper side in the thickness direction) are arranged along the curves of respective different curvatures.

The cells in the diagrams represent scintillator blocks or detector units.

Figure 18B:
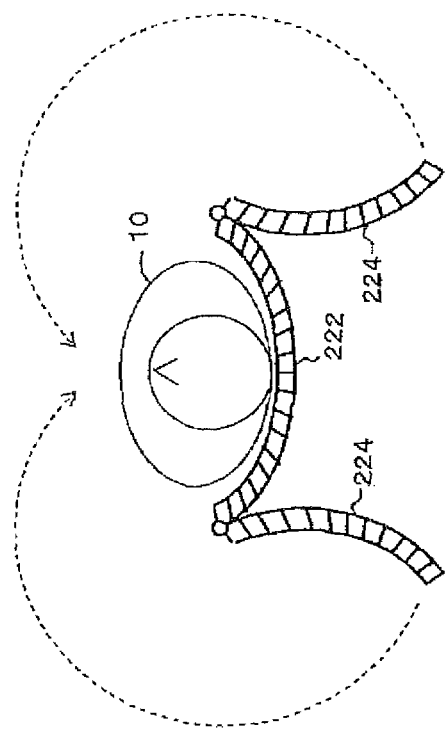
FIGS. 18A and 18B are cross-sectional views showing the configuration and operation of an eighth embodiment of the present invention.
Figure 18A:
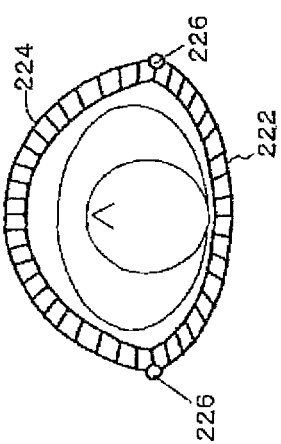

In an eighth embodiment shown in FIGS. 18A and 18B, an arched half PET detector 224 on the upper side in the thickness direction is openable, for example, in a double-door configuration so as to facilitate setting up the patient 10. In the diagrams, 222 denotes the lower (bed-side) PET detector, and 226 denotes hinges.

Figure 19:
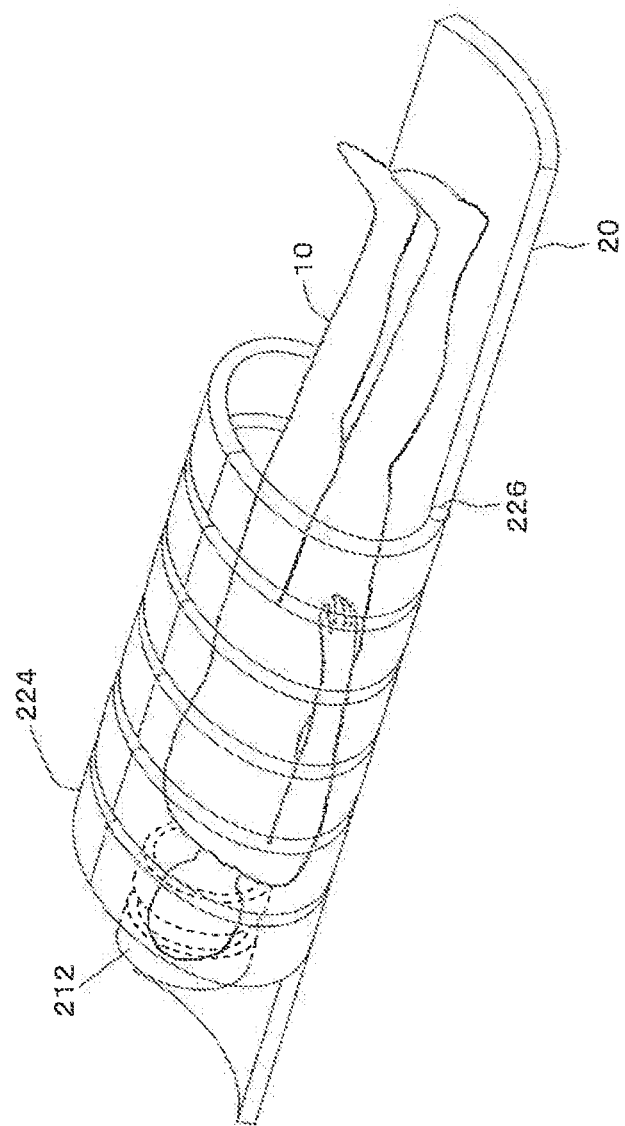
FIG. 19 is a perspective view of the same.

Since the PET detector is heavy in weight, it may be divided into several sections as shown in FIG. 19 (six sections in FIG. 19).

As in a modification shown in FIGS. 20A and 20B, the PET detector may be formed in a single-door configuration.

Alternatively, as in a ninth embodiment shown in FIG. 21, the PET detector may be configured so that it is divided into an arched half detector 222 on the bed side (lower side in the thickness direction) and an arched half detector 224 on the opposite side (upper side in the thickness direction). Various sizes of upper detectors 224 may be provided according to the body type.

As in a tenth embodiment shown in FIG. 22, detector units 204 may be connected into a belt-like configuration by links 232. The same belt-like PET detectors 230 can be used to form various sizes of detector rings according to the body type. In the lower half, or the bed portion, the detector units 204 are fixed by fixing wires 234, for example.

Figure 24:
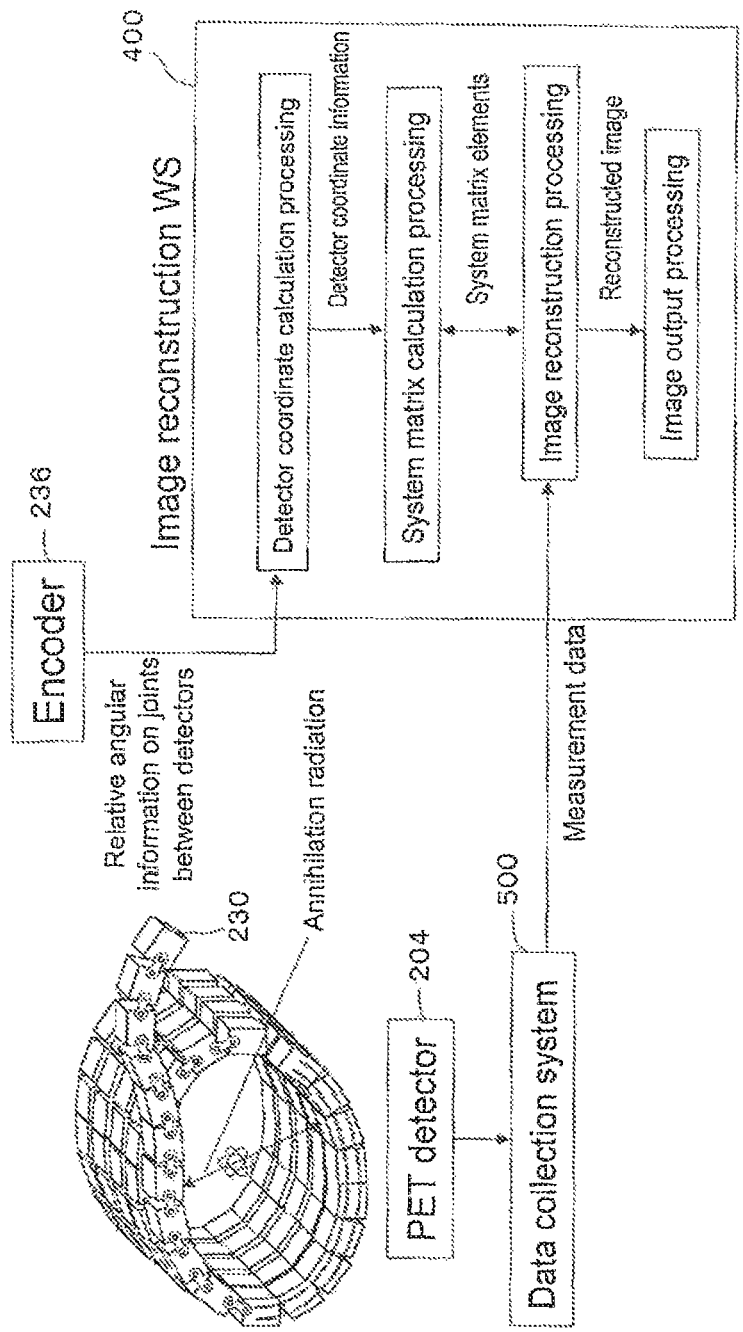
FIG. 24 is a block diagram showing signal processing and image reconstruction processing according to the tenth embodiment.

As shown in FIG. 23, encoders 236 for acquiring angular information are attached to the joints of the detector units 204 on the upper side in the thickness direction. As shown in FIG. 24, relative positions between the detector units 204 (the relationship in spatial position coordinates between adjoining detector units) can thus be acquired to obtain a tomographic image by image reconstruction calculations.

With reference to FIG. 24, a description will be given of the relationship between the encoders 236 and an image reconstruction workstation (WS) 400 when the layout pattern of the PET detector is changed according to the subject's body type. Pairs of annihilation radiations detected by the PET detector 204 are processed into measurement data by a data collection system 500 through coincidence processing, data collection processing, etc. The measurement data is transmitted to the image reconstruction WS 400 for image reconstruction processing before output as a tomographic image. The image reconstruction needs accurate detector positions, or it is not possible to calculate the system matrix. The encoders 236 are then used to grasp the relationship in spatial position coordinates between the adjoining detector units, thereby grasping the positions of the respective detectors.

Specifically, the encoders 236 provide relative angular information on the joints between the detectors. The information is transmitted to the image reconstruction WS 400. The detector coordinates are initially determined by detector coordinate calculation processing. The system matrix is then calculated based on the detector coordinates. For the image reconstruction processing, a whole system matrix calculated may be read at a time. Or, necessary system matrix elements may be calculated by on-the-fly processing when needed.

FIG. 25A shows a case with small detector rings according to the tenth embodiment. FIG. 25B shows a case with large detector rings.

Figure 27:
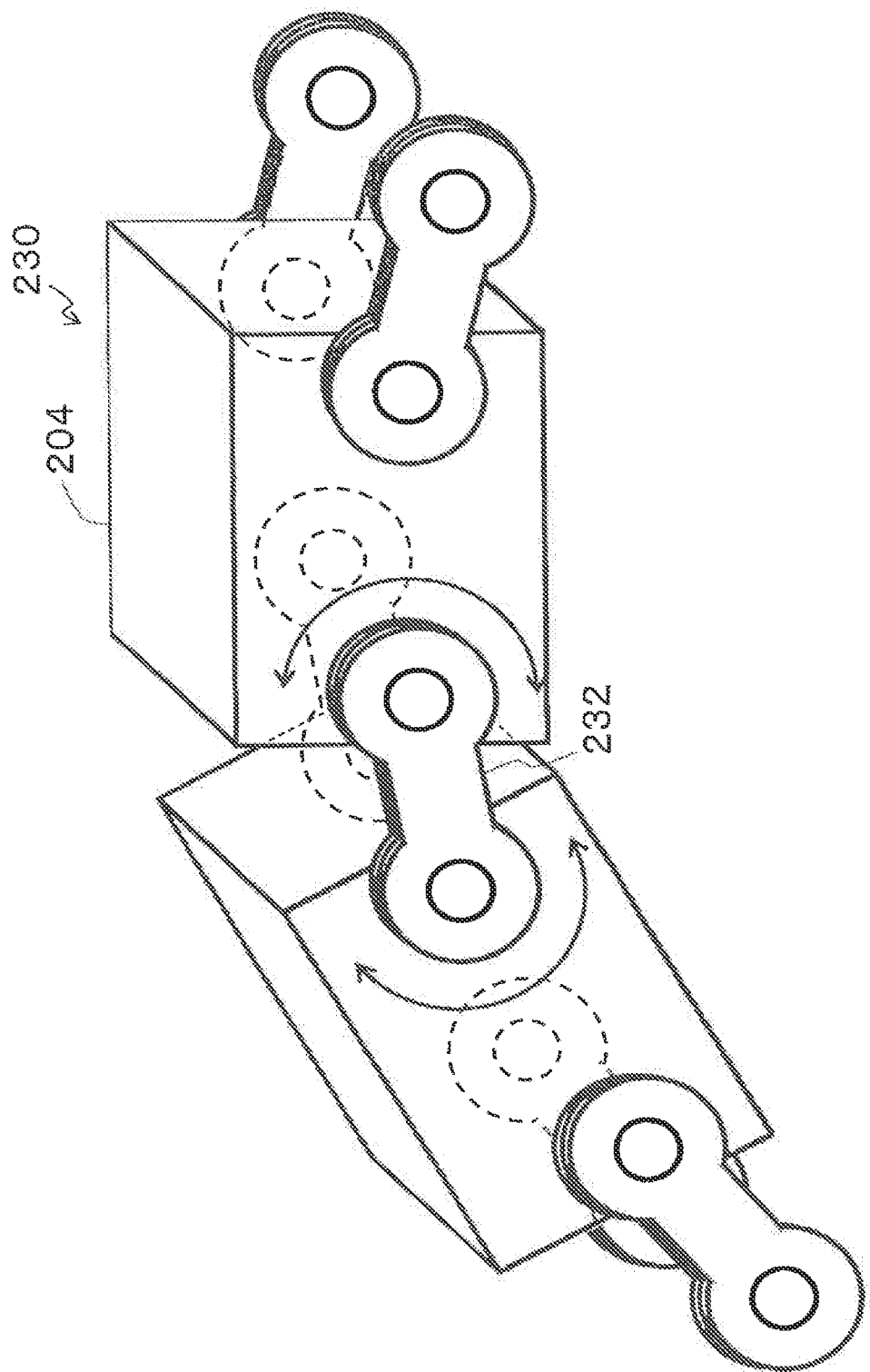
FIG. 27 is a perspective view showing the configuration of joints of the belt-like PET detector used in the eleventh embodiment.

As in an eleventh embodiment shown in FIGS. 26A and 26B, large and small inner frames 30 attachable to the bed 20 may be prepared for respective body types. This makes it possible to accurately and easily grasp the spatial position coordinates (detector positions) of the belt-like PET detector 230 having no encoders such as shown in FIG. 27. Such inner frames 30 are formed to have high rigidity as well as high transparency to radiation. For example, the inner frames 30 are made of reinforced plastic.

Figure 29A:
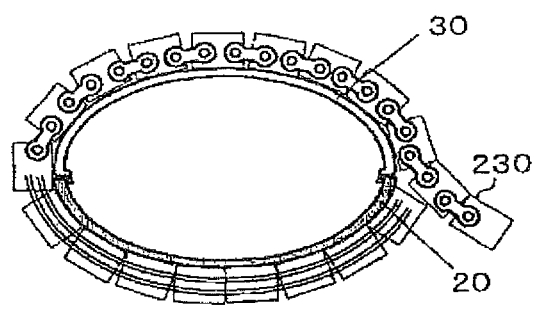
FIGS. 29A and 29B are cross-sectional views showing examples of the attached state.
Figure 29B:
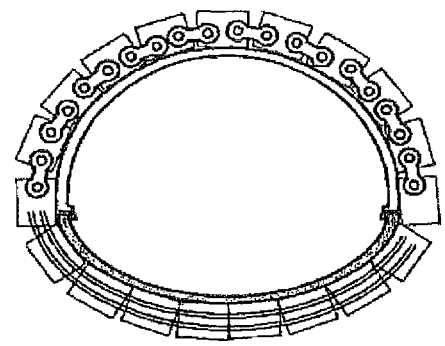

FIG. 28 shows the state where the belt-like PET detector 230 is being attached to an inner frame 30 according to the eleventh embodiment. FIGS. 29A and 29B show attached states. FIG. 29A shows an example of small ring size, and FIG. 29B shows an example of large ring size.

Figure 30:
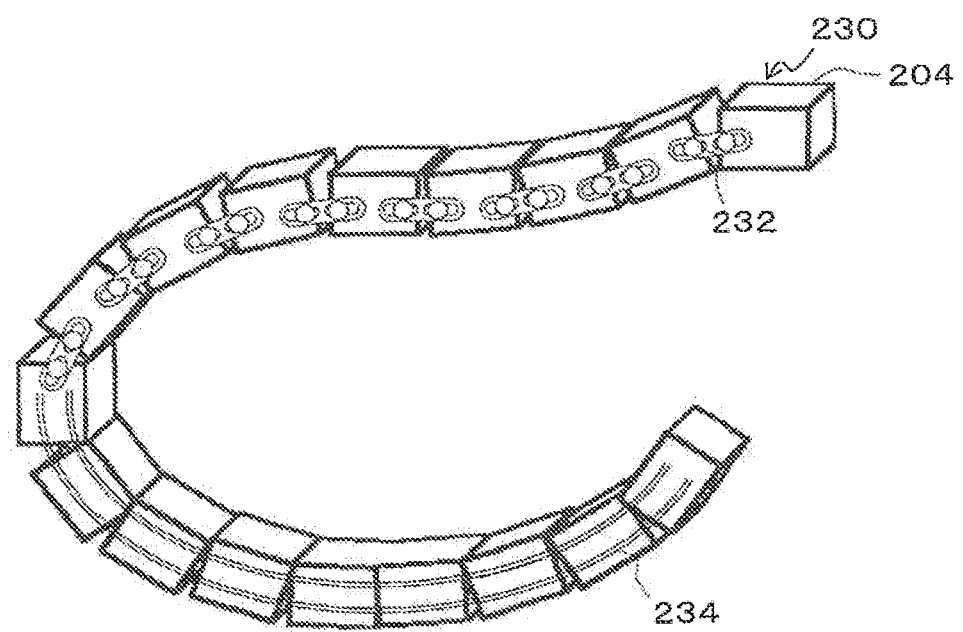
FIG. 30 is a perspective view showing a belt-like PET detector used in a twelfth embodiment of the present invention.

The belt-like PET detector 230 may not only allow free rotations of the detector units 204, but also make the distances between the detector units 204 variable as in a twelfth embodiment shown in FIG. 30. FIG. 31 shows the joints in detail.

Figure 32A:
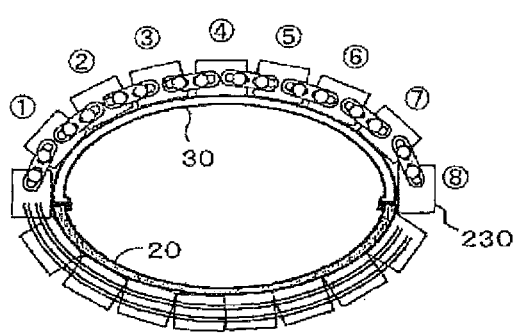
FIGS. 32A and 32B are cross-sectional views showing examples of the attached state.
Figure 32B:
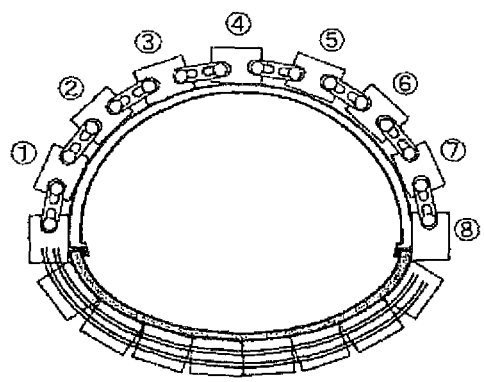

FIG. 32A shows the state of attachment of small ring size according to the twelfth embodiment. FIG. 32B shows the state of attachment of large ring size. Rings of different sizes can be formed by using the same number of detectors (in FIGS. 32A and 32B, eight movable detector units) without redundant detectors as in FIG. 29A.

Figure 33:
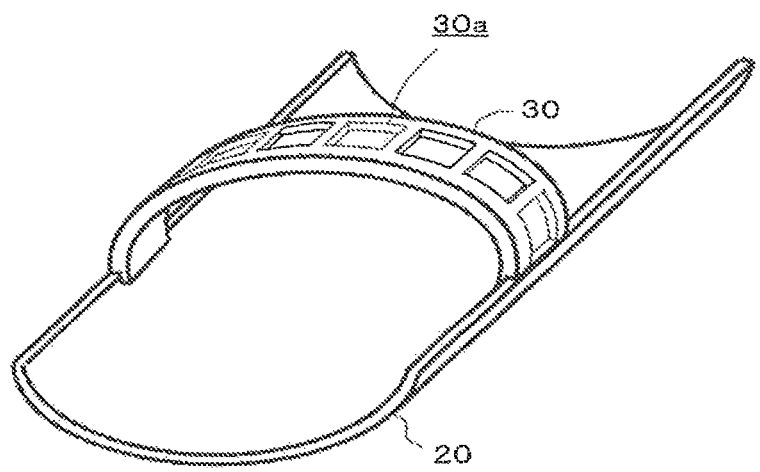
FIG. 33 is a perspective view showing an inner frame that is used in a modification of the twelfth embodiment.

As in a modification of the twelfth embodiment shown in FIG. 33, positioning recesses 30a may be formed in the inner frame 30 so as to fix the detector positions.

Figure 21A:
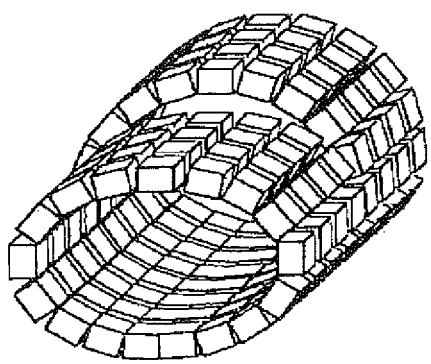
FIGS. 21A and 21B are perspective views showing the configuration and operation of essential parts of a ninth embodiment of the present invention.
Figure 21B:
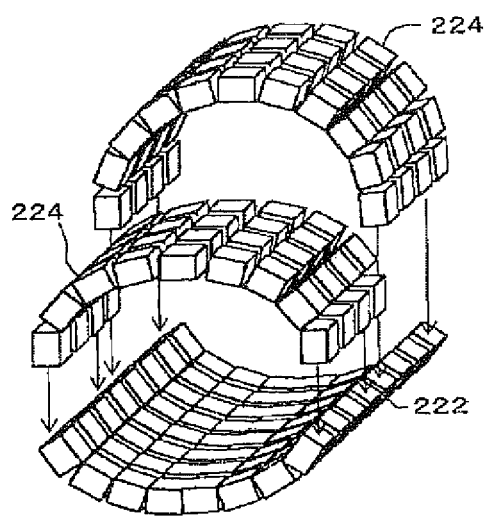

Now, a description will be given of the image reconstruction processing when various sizes of arched upper half detectors 224 and inner frames 30 are prepared in advance and appropriate ones are selected according to the patient's body type (size and shape) as in the ninth embodiment shown in FIGS. 21A and 21B or the eleventh embodiment shown in FIGS. 26A and 26B. Since the layout of the detector units is uniquely determined by the size and shape of the upper detector 224 or inner frame 30 selected, it is possible to acquire the spatial position coordinates of the detector units without encoders. Specifically, the type of the upper detector 224 or inner frame 30 selected may be entered by the user from a console. Identification tags may be attached to the upper detectors 224 or inner frames 30 so that the type used is automatically detected on the side of the bed 20.

As shown in FIG. 24, the system matrix may be calculated each time based on the detector coordinates. Since the types of the upper detectors 224 or inner frames 30 for use are limited, system matrices corresponding to the respective patterns of detector layout may be calculated in advance and stored into a storing device in the image reconstruction WS as a data set.

Figure 34:
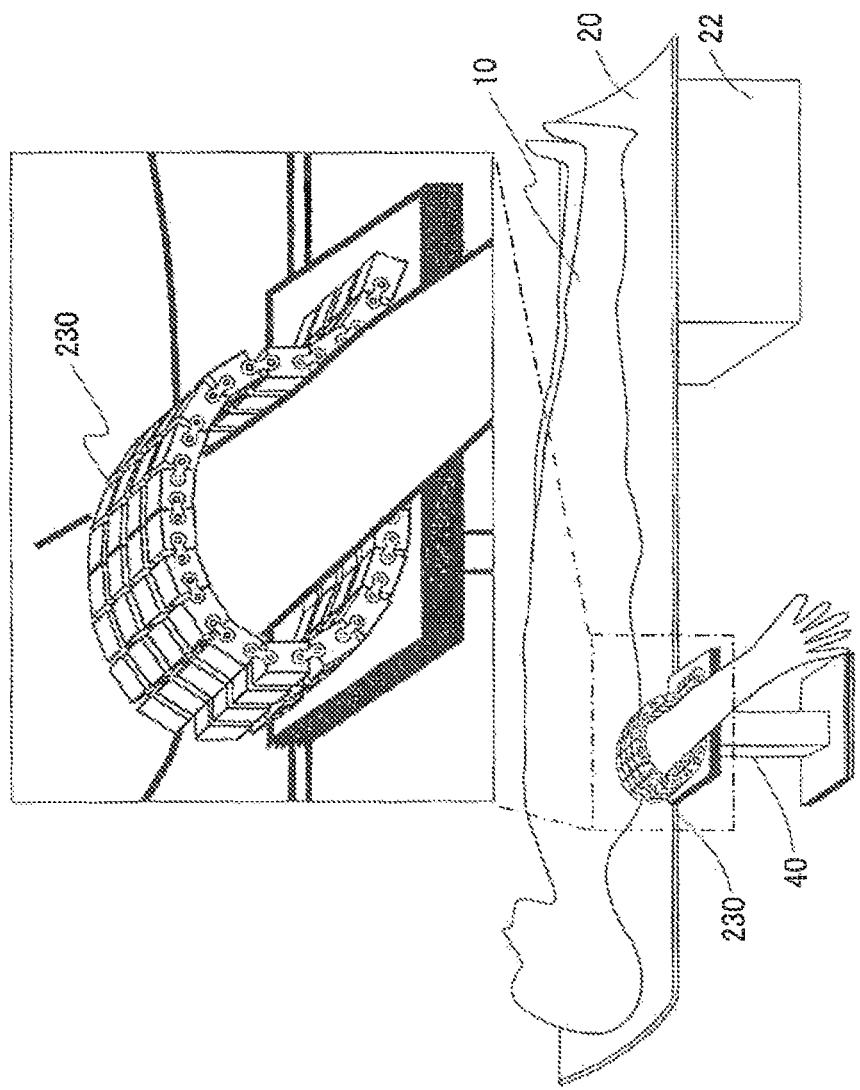
FIG. 34 is a perspective view showing the configuration of a thirteenth embodiment of the present invention.

The belt-like PET detectors may be used not only for the head and body, but also for some specific areas. FIG. 34 shows a thirteenth embodiment which shows another application example of the belt-like PET detectors. Here, a belt-like PET detector 230 for arms is wound around the arm. The reference numeral 40 denotes a table on which the belt-like PET detector is placed.

For example, dynamic function measurement on the head, using a head PET device (not shown in the diagram), is not easy to perform since arterial blood needs to be sampled at time intervals of several seconds to several minutes. The combined use of the head PET device and the belt-like PET detector wound around the arm can facilitate the dynamic function measurement since it is possible without arterial blood sampling to measure the concentration and flow rate of RI flowing through the arteries in the arm. Aside from arterial blood sampling, the belt-like PET detector also allows area-specific high-precision diagnostic imaging. Examples of the area include the arms as well as the feet, joints, neck, and breast.

Figure 35A:
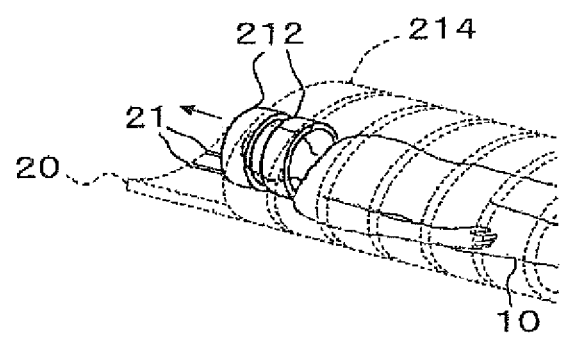
FIGS. 35A and 35B are perspective views showing the configuration of essential parts of a fourteenth embodiment of the present invention.
Figure 35B:
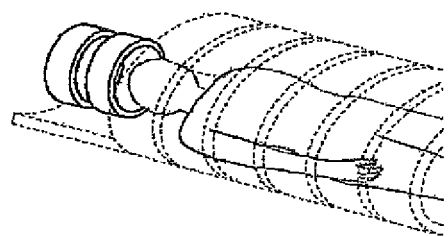
Figure 36A:
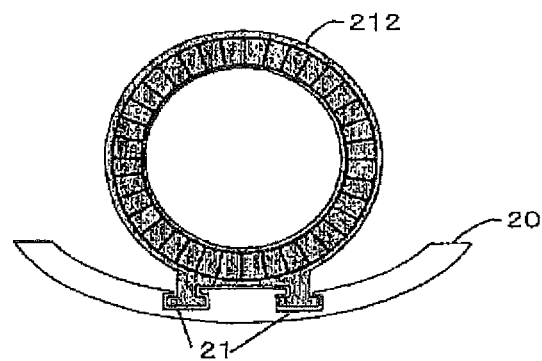
FIG. 36A is a cross-sectional view and FIG. 36B is a plan view of the same.
Figure 36B:
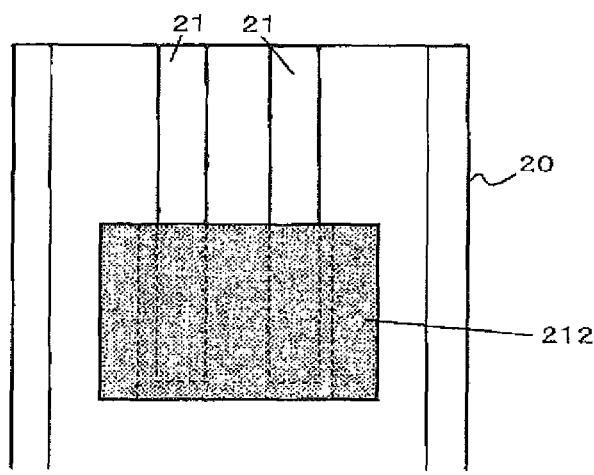

In a fourteenth embodiment shown in FIGS. 35A and 35B, the head PET detector 212 can be slid over guide rails 21 of the bed 20 in the direction of the body axis so as to facilitate setting up the patient 10. FIG. 36 shows the slide mechanism in detail. The head PET detector 212 may be detachable.

As in a fifteenth embodiment shown in FIGS. 37A and 37B, the bed 20 and the PET detector 210 may be independently slidable when the PET field of view P lies between the field of view F of the RF coil and the MRI field of view M.

According to the present embodiment, the bed 20 and the PET detector 210 can be slid at different speeds so that a wider field of view corresponding to the width of the field of view F of the RF coil can be measured by PET and MRI.

Figure 38A:
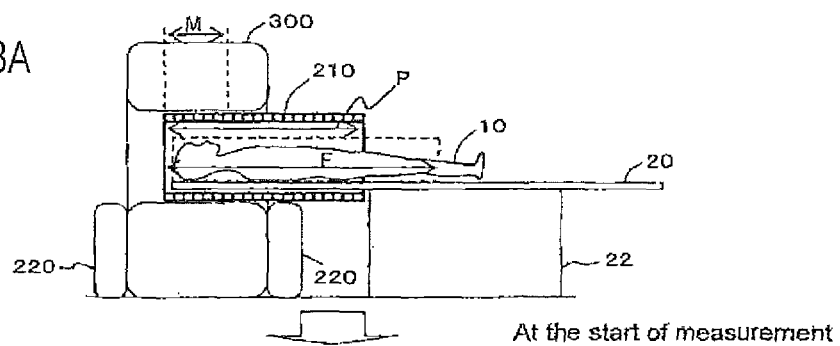
FIGS. 38A to 38C are sectional views showing the operating state of the fifteenth embodiment.
Figure 38B:
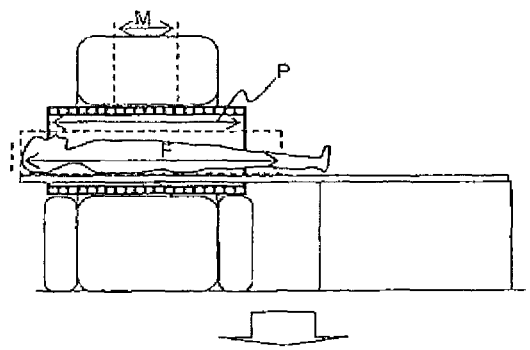
Figure 38C:
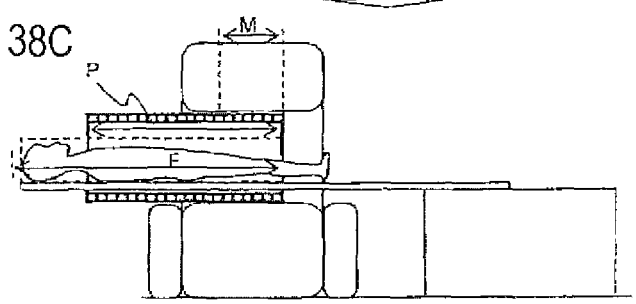

FIGS. 38A to 38C show the states from the start to the end of the examination according to the present embodiment. Assuming that the bed moving speed Vb and the PET detector moving speed Vp both are constant, Vp and Vb are given by the following equations:

$$Vp=(P-M)/T, \text{ and} \quad (2)$$

$$Vb=(F-M)/T, \quad (3)$$

where T=the MRI measurement time=the PET measurement time.

The fifteenth embodiment has dealt with the case where the PET detector is integrated in the direction of the body axis. As in a sixteenth embodiment shown in FIGS. 39A and 39B, the head PET detector 212 and the body PET detector 214 may be separated from each other. The head PET detector 212 and the bed 20 are integrated with each other, and slide at a speed of Vb. The body PET detector 214 slides at a speed of Vp.

Figure 40A:
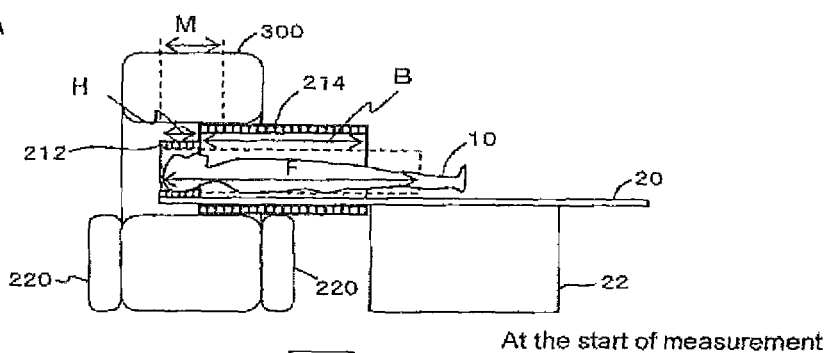
FIGS. 40A to 40C are sectional views showing the operating state of the same.
Figure 40B:
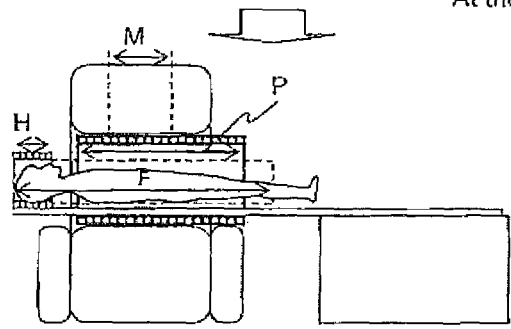
Figure 40C:
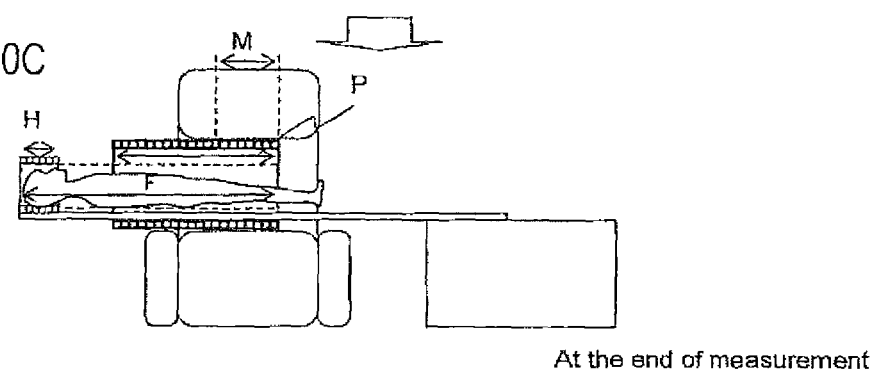

FIGS. 40A to 40C show the states of movement from the start to the end of the examination according to the sixteenth embodiment. Assuming that the bed moving speed Vb and the PET detector moving speed Vp both are constant, Vp and Vb are expressed by the following equations:

$$Vp=(B+H-M)/T, \text{ and} \quad (4)$$

$$Vb=(F-M)/T, \quad (5)$$

where T=the MRI measurement=the PET measurement time.

Figure 41A:
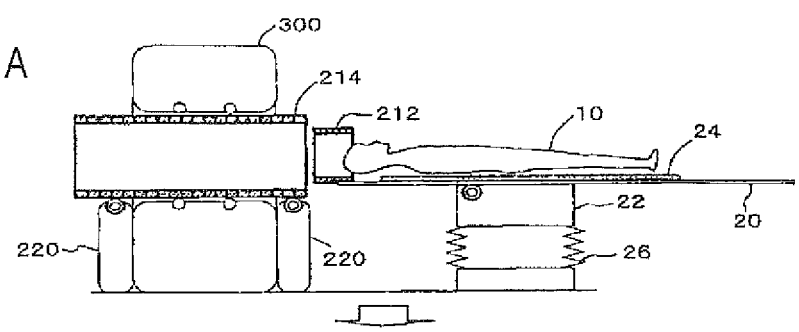
FIGS. 41A to 41C are sectional views seen from a side, showing the operating state of a seventeenth embodiment of the present invention.
Figure 41B:
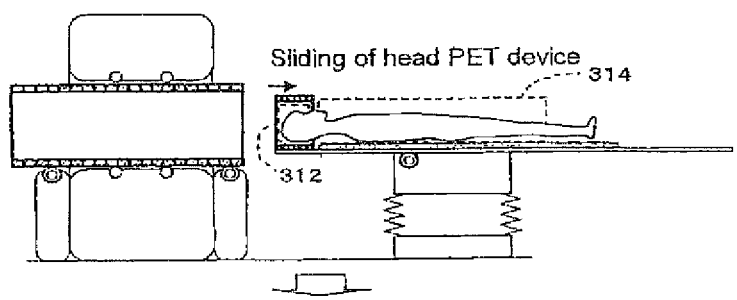
Figure 41C:
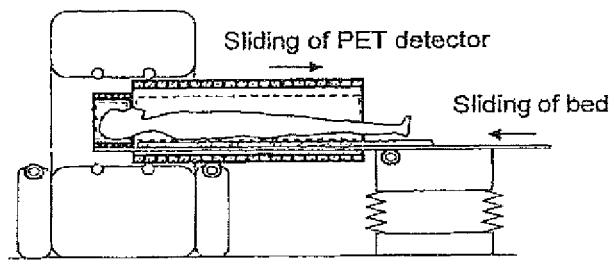

As in a seventeenth embodiment shown in FIGS. 41A to 41C, the PET detector (or at least the body PET detector 214) may have a mechanism for making a movement independent of the movement of the bed 20. In such a case, the PET detector 214 can be moved into the MRI detector 300 for easy patient setup without a contrivance to open the PET detector.

More specifically, for patient setup, as shown in FIG. 41A, the PET detector 214 is moved into the MRI patient port 302 so that the patient 10 can easily get on the bed 20. The head PET detector 212, if used, is moved to the left in the diagram.

Next, the RF coils 312 and 314 and the head PET detector 212 are attached as shown in FIG. 41B. Specifically, the head and body RF coils 312 and 314 are initially attached. The head PET detector 212, if used, is slid for attachment. The head RF coil 312 may be integrated with the head PET detector 212.

Finally, as shown in FIG. 41C, the bed 20 and the PET detector 214 are slid to a predetermined MRI measurement start position.

After the examination, the patient can be evacuated in order reverse to the foregoing.

While the diagrams show the configuration where the patient enters the MRI patient port 302 head first, the MRI patient port 302 may be entered feet first.

Figures 42A, 42B:
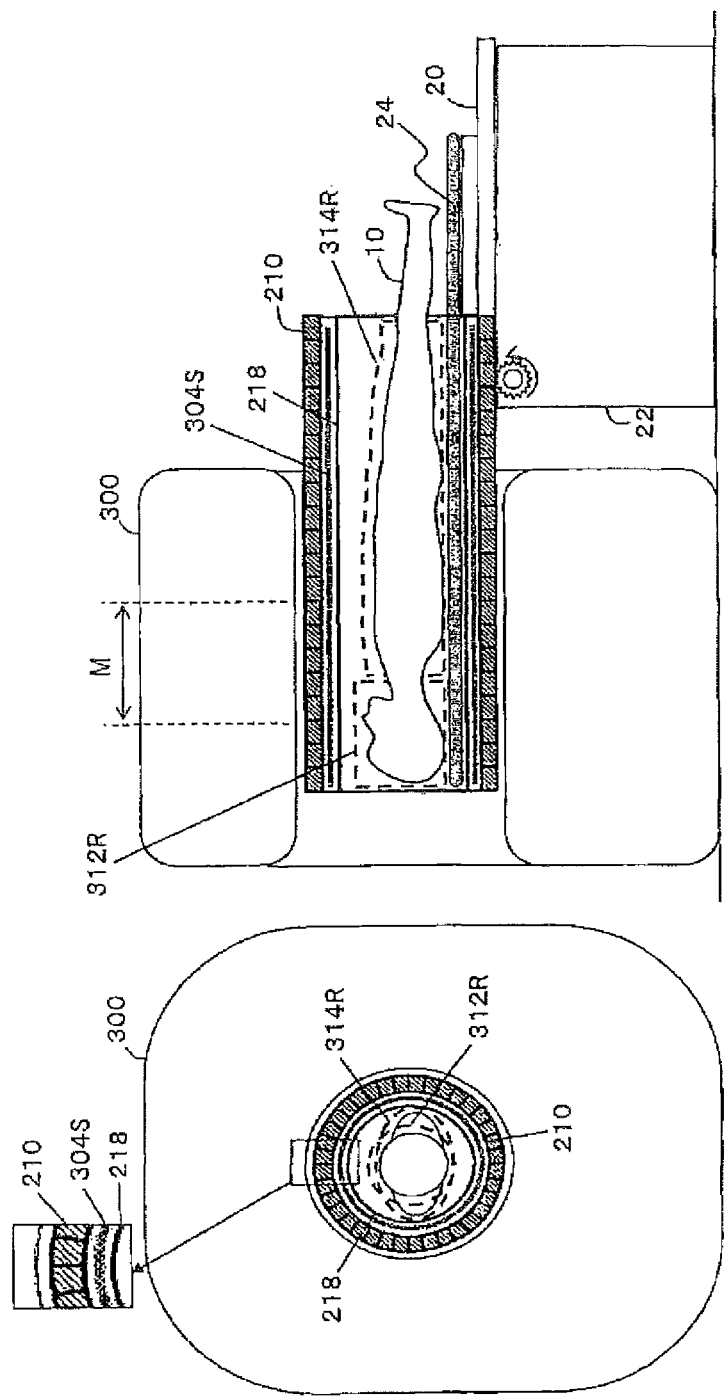
FIG. 42A is a front view and FIG. 42B is a sectional view seen from a side, showing the overall configuration of an eighteenth embodiment of the present invention.

As in an eighteenth embodiment shown in FIGS. 42A and 42B, a transmitter RF coil 304S may be integrally arranged inside the PET detector 210. A receiver RF coil is arranged closer to the patient. A head RF coil 312R and a body RF coil 314R of different sizes may be used.

FIG. 43 shows a nineteenth embodiment for measuring a local area, not the whole body, by PET and MRI at the same time. The PET detector 210 is slidable along the guide rails 21 on the bed 20, so that the PET detector 210 can be freely moved to the position of the area to measure. The PET detector 210 can be accurately and safely mounted on the measurement area when outside of the MRI patient port 302. Since the PET detector 210 mounted is slid with the patient on the bed 20, there is no danger of displacement. The difference in level between the bed 20 and the PET detector 210 is eliminated by the provision of cushions 24. The cushions 24 need to be adjusted in length depending on the position of the PET detector 210.

FIG. 44 is a perspective view showing the configuration of essential parts of a twentieth embodiment which is a modification of the nineteenth embodiment. The bed 20 is composed of a base 20B which includes the guide rails 21, and supports 20S and a cover 20C. The PET detector 210 is arranged so that part of the ring is interposed between the base 20B and the cover 20C. Such a configuration eliminates a difference in level on the cover 20C which makes contact with the patient. In addition, the PET detector 210 can conveniently be slid to an appropriate position where to cover the measurement point with the patient put on the bed.

FIG. 45 is a sectional view seen from a side, showing the overall configuration of the twentieth embodiment. Here, the RF coil 304 is integrally arranged inside the PET detector 210.

Figure 46A:
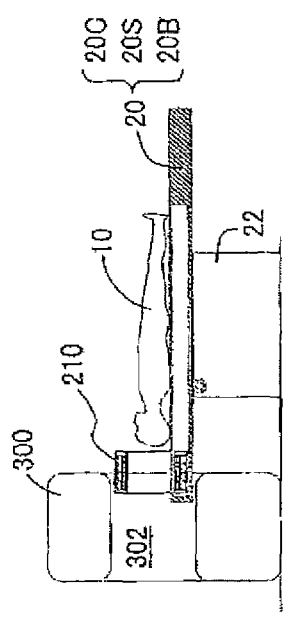
FIGS. 46A to 46C are sectional views showing the operating state of the same.
Figure 46B:
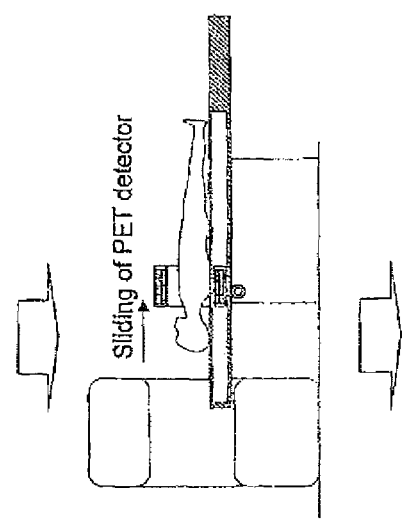
Figure 46C:
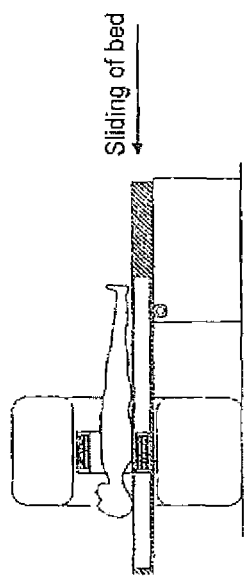

FIGS. 46A to 46C show the operating state of the twentieth embodiment. When setting a patient on the bed, as in FIG. 46A, the bed is located away from the MRI patient port 302 and the PET detector 210 is moved to the bed end. After the patient is laid on, as in FIG. 46B, the PET detector 210 is slid so that the measurement point (in the diagram, chest) is covered by the PET detector 210. After the completion of the patient setup, the PET detector 210 is inserted into the MRI patient port 302 and the MRI measurement is started.

According to the present invention, it is possible to perform PET and MRI concurrent examinations and a whole-body PET/MRI examination with extremely high utility.

What is claimed is:

1. A method for obtaining a PET image and an MRI image using a PET/MRI device including an MRI device having a measurement port, a PET detector insertable into the measurement port, and a drive mechanism configured to slide the PET detector into the measurement port, the method comprising:
    starting a PET measurement with the PET detector;
    sliding the PET detector along a sliding direction into and out of the measurement port with the drive mechanism after PET measurement is started;
    starting an MRI measurement with the MRI device;
    performing the MRI measurement with the MRI device while the PET detector is sliding;
    ending the MRI measurement;
    sliding the PET detector to an initial position with the drive mechanism after the MRI measurement is ended and before the PET measurement is ended such that the PET measurement is conducted while the PET detector is sliding;
    stopping the sliding of the PET detector; and
    ending the PET measurement,
    wherein the PET detector has a measurement field of view having a width wider than a width of the MRI device in the sliding direction of the PET detector.

2. A method for obtaining a PET image and an MRI image using a PET/MRI device including an MRI device having a measurement port, a PET detector insertable into the measurement port, and a drive mechanism configured to slide the PET detector into the measurement port, the method comprising:
    starting a PET measurement with the PET detector;
    sliding the PET detector along a sliding direction into and out of the measurement port with the drive mechanism after PET measurement is started;
    stopping the PET detector from sliding for operator evacuation and then restarting the slide movement of the PET detector prior to starting an MRI measurement;
    starting an MRI measurement with the MRI device;
    performing the MRI measurement with the MRI device while the PET detector is sliding;
    ending the MRI measurement;
    stopping the sliding of the PET detector; and
    ending the PET measurement,
    wherein the PET detector has a measurement field of view having a width wider than a width of the MRI device in the sliding direction of the PET detector.

3. The method according to claim 1, wherein the MRI measurement is started or ended at a center of an MRI measurement field of view.

4. The method according to claim 1, wherein the PET detector is slid at constant speed.

5. The method according to claim 1, wherein the PET detector is moved step by step.

* * * * *